United States Patent
Chen et al.

(10) Patent No.: US 10,283,202 B1
(45) Date of Patent: May 7, 2019

(54) REDUCING DISTURBS WITH DELAYED RAMP UP OF SELECTED WORD LINE VOLTAGE AFTER PRE-CHARGE DURING PROGRAMMING

(71) Applicant: SanDisk Technologies LLC, Plano, TX (US)

(72) Inventors: Hong-Yan Chen, San Jose, CA (US); Yingda Dong, San Jose, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 15/814,772

(22) Filed: Nov. 16, 2017

(51) Int. Cl.
G11C 16/08 (2006.01)
G11C 16/30 (2006.01)
G11C 16/32 (2006.01)

(52) U.S. Cl.
CPC ............ G11C 16/08 (2013.01); G11C 16/30 (2013.01); G11C 16/32 (2013.01)

(58) Field of Classification Search
CPC .......... G11C 16/08; G11C 16/32; G11C 16/30
See application file for complete search history.

(56) References Cited

U.S. PATENT DOCUMENTS

| | | | |
|---|---|---|---|
| 7,623,386 B2 | 11/2009 | Dong et al. |
| 9,093,157 B2 | 7/2015 | Kwak et al. |
| 9,286,987 B1 | 3/2016 | Dong et al. |
| 9,286,994 B1 | 3/2016 | Chen et al. |
| 9,336,892 B1 | 5/2016 | Chen et al. |
| 9,460,805 B1 | 10/2016 | Pang et al. |
| 9,466,369 B1 | 10/2016 | Pang et al. |
| 9,530,506 B2 | 12/2016 | Rabkin et al. |
| 9,640,273 B1 | 5/2017 | Chen et al. |
| 9,691,781 B1 | 6/2017 | Nishikawa et al. |
| 2009/0067248 A1 | 3/2009 | Lee |
| 2009/0103365 A1 | 4/2009 | Roohparvar et al. |
| 2012/0307561 A1 | 12/2012 | Joo et al. |
| 2013/0242667 A1 | 9/2013 | Shim et al. |

(Continued)

FOREIGN PATENT DOCUMENTS

KR 10-2005-0108136 A 11/2005

OTHER PUBLICATIONS

U.S. Appl. No. 15/678,683, filed Aug. 16, 2017, by Chen et al.

(Continued)

*Primary Examiner* — Mohammed A Bashar
(74) *Attorney, Agent, or Firm* — Vierra Magen Marcus LLP

(57) ABSTRACT

A memory device and associated techniques for reducing hot electron injection type of disturbs of memory cells. In one approach, after a pre-charge operation, voltages of a first group of adjacent word lines comprising a selected word line (WLn) and one or more drain-side word lines of WLn are increased after voltages of remaining word lines are increased. In another approach, after the pre-charge operation, voltages of the first group of adjacent word lines are increased in steps while voltages of remaining word lines are continuously increased. In another approach, voltages of the first group of adjacent word lines are increased from a negative voltage while voltages of remaining word lines are increased from 0 V. In another aspect, the disturb countermeasures can be implemented according to the position of WLn in a multi-tier stack.

20 Claims, 29 Drawing Sheets

(56) References Cited

U.S. PATENT DOCUMENTS

2016/0093390 A1\* 3/2016 Yuan .................. G11C 16/3427
714/764
2016/0148691 A1\* 5/2016 Rabkin .................. G11C 16/10
365/185.19

OTHER PUBLICATIONS

U.S. Appl. No. 15/693,982, filed Sep. 1, 2017, by Diep et al.
U.S. Appl. No. 15/726,686, filed Oct. 6, 2017, by Yu et al.
Machine-translation in English of KR Publication No. 10-2005-0108136 published Nov. 16, 2005.
International Search Report & the Written Opinion of the International Searching Authority dated Jan. 15, 2019, International Application No. PCT/US2018/052375.

\* cited by examiner

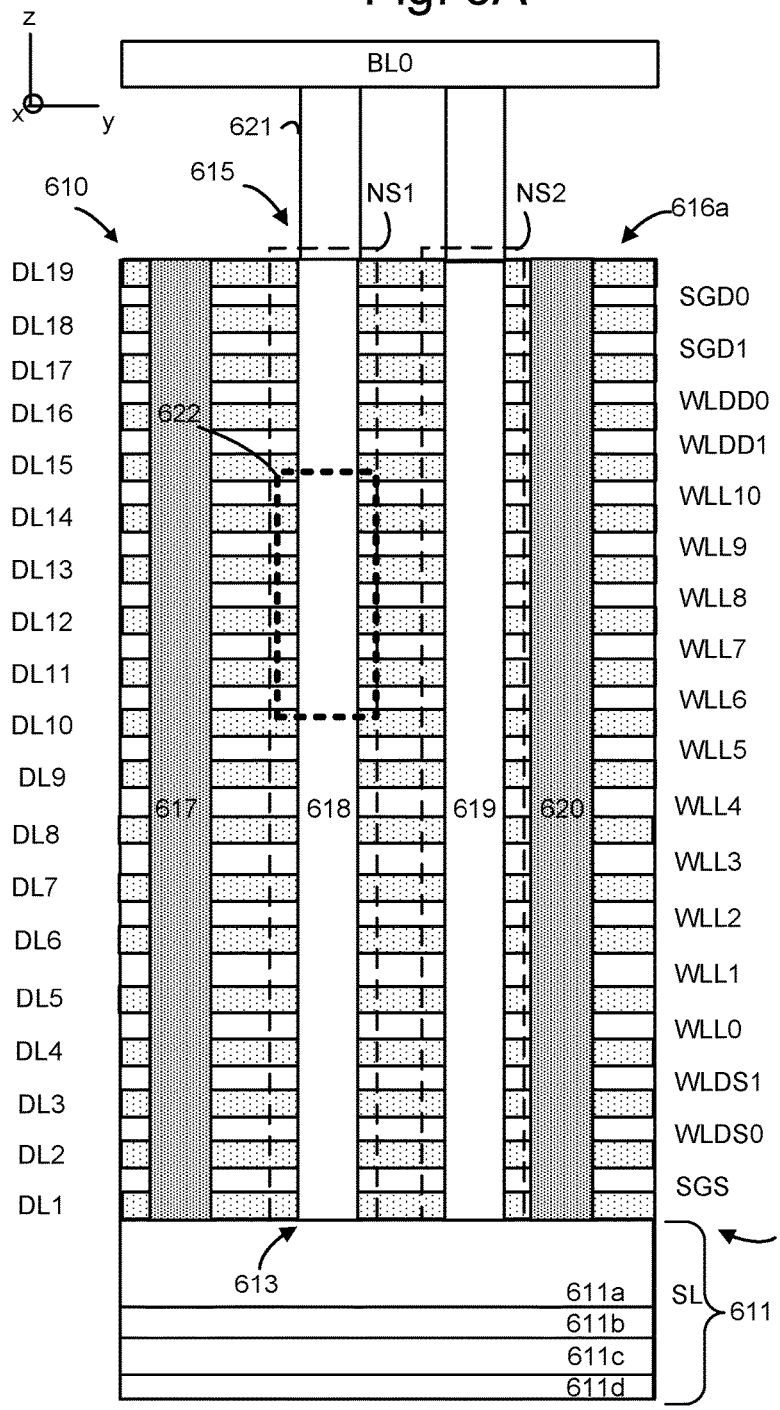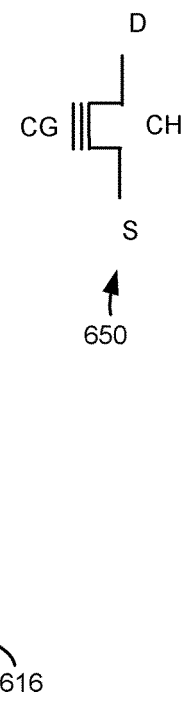

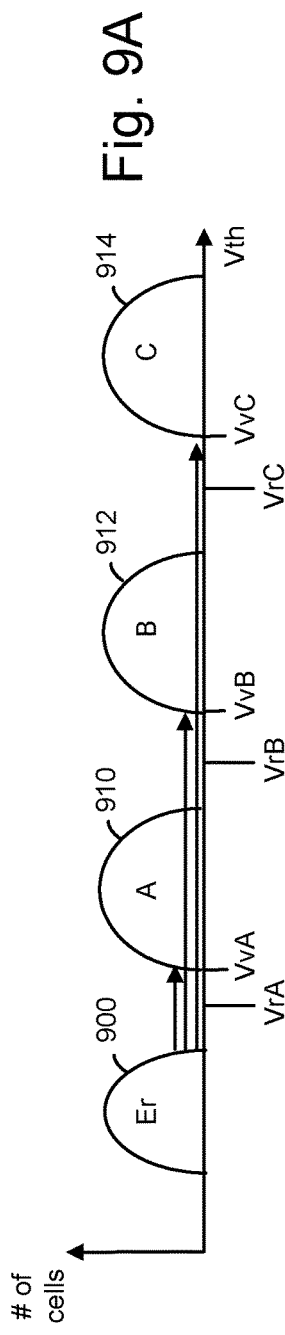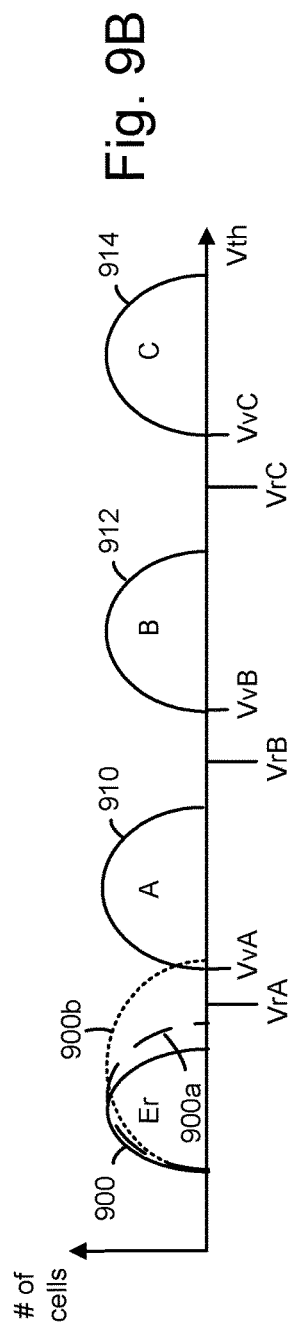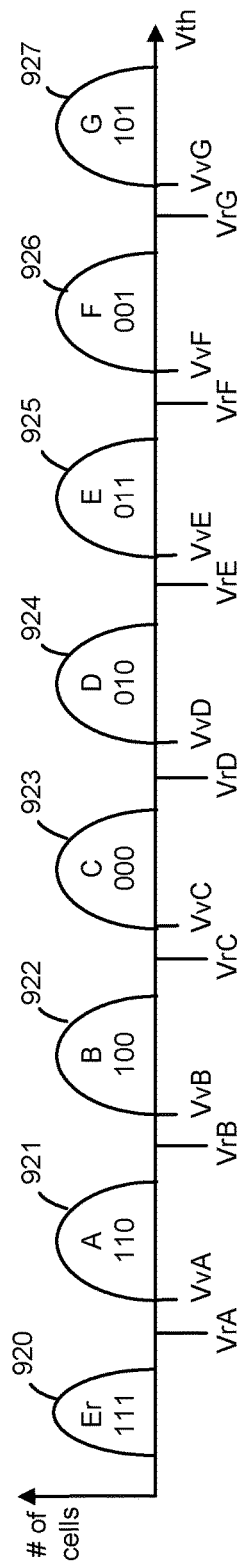

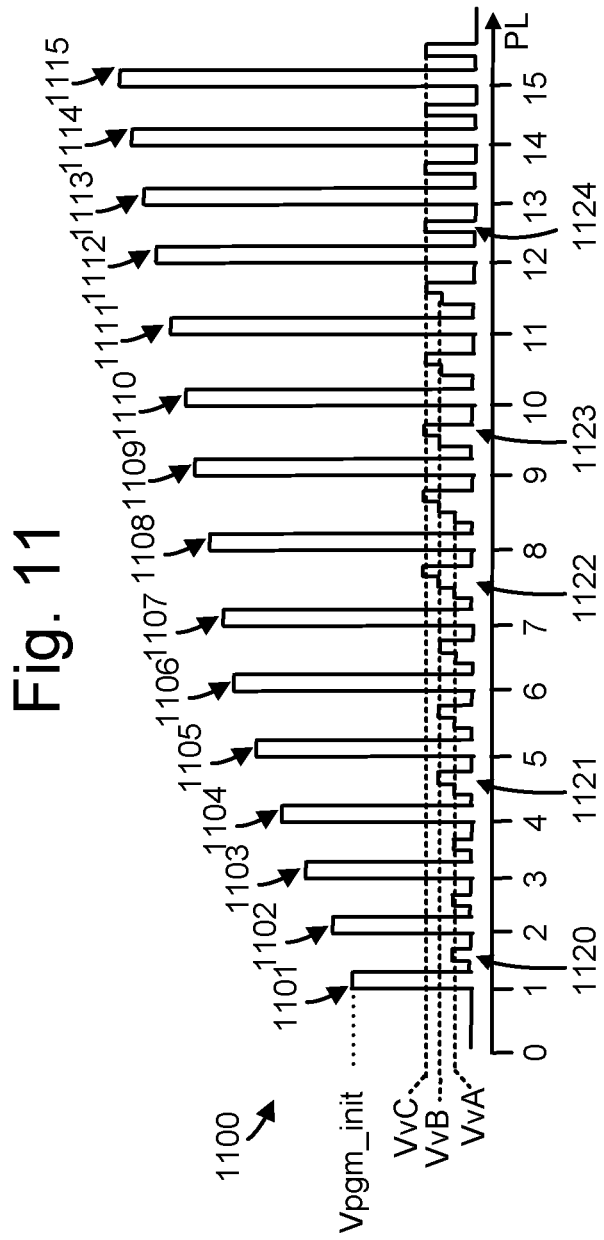

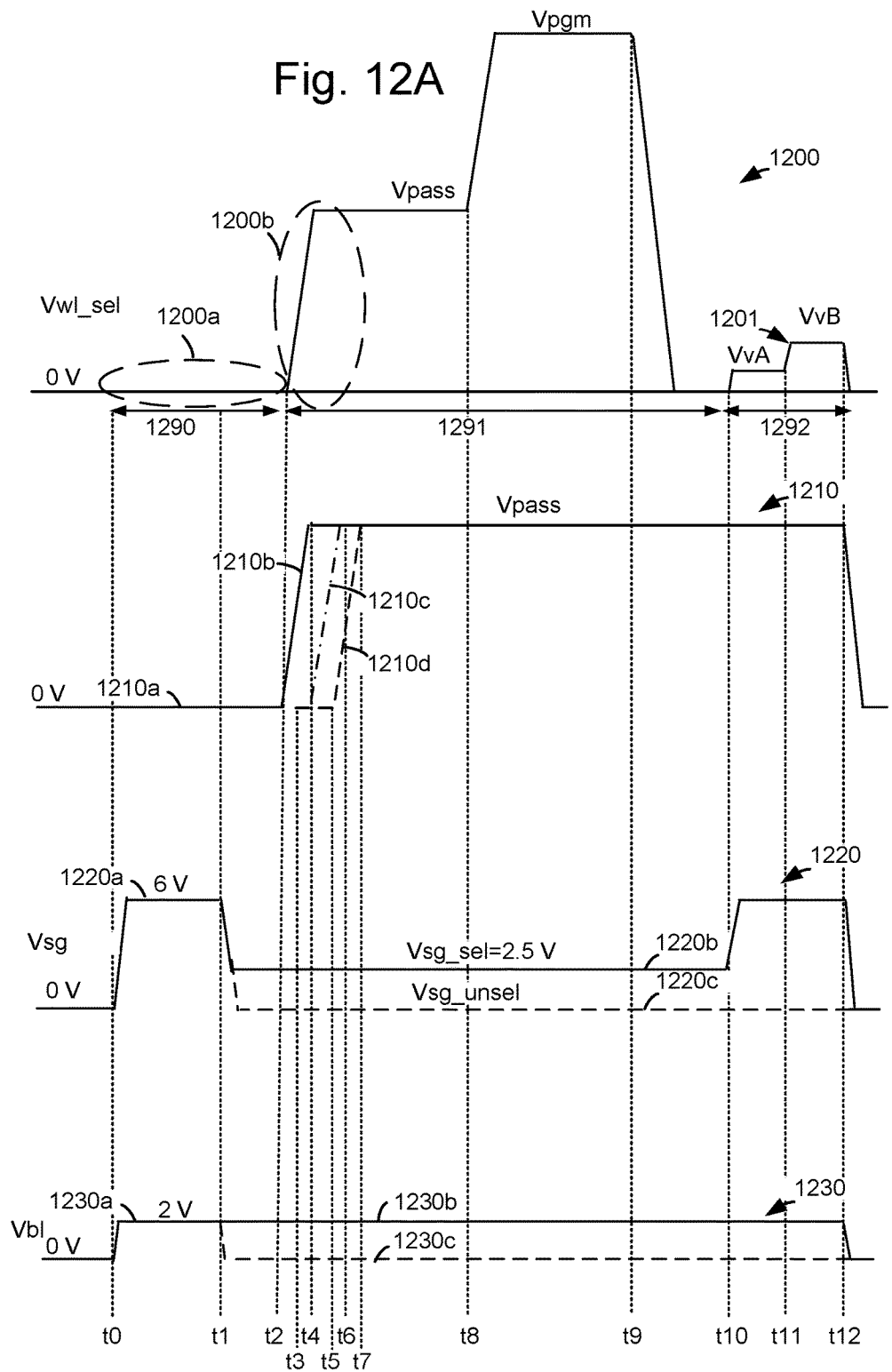

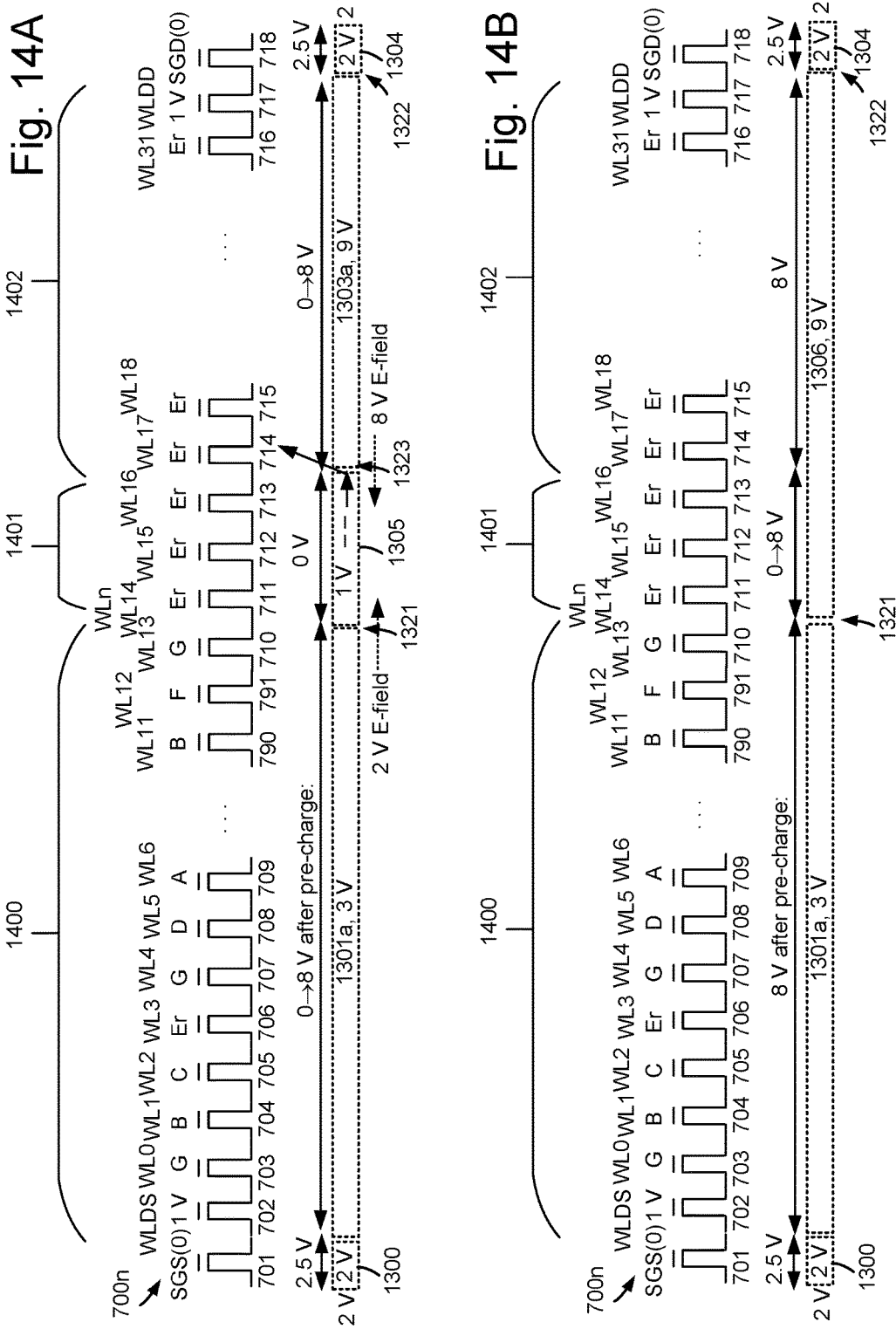

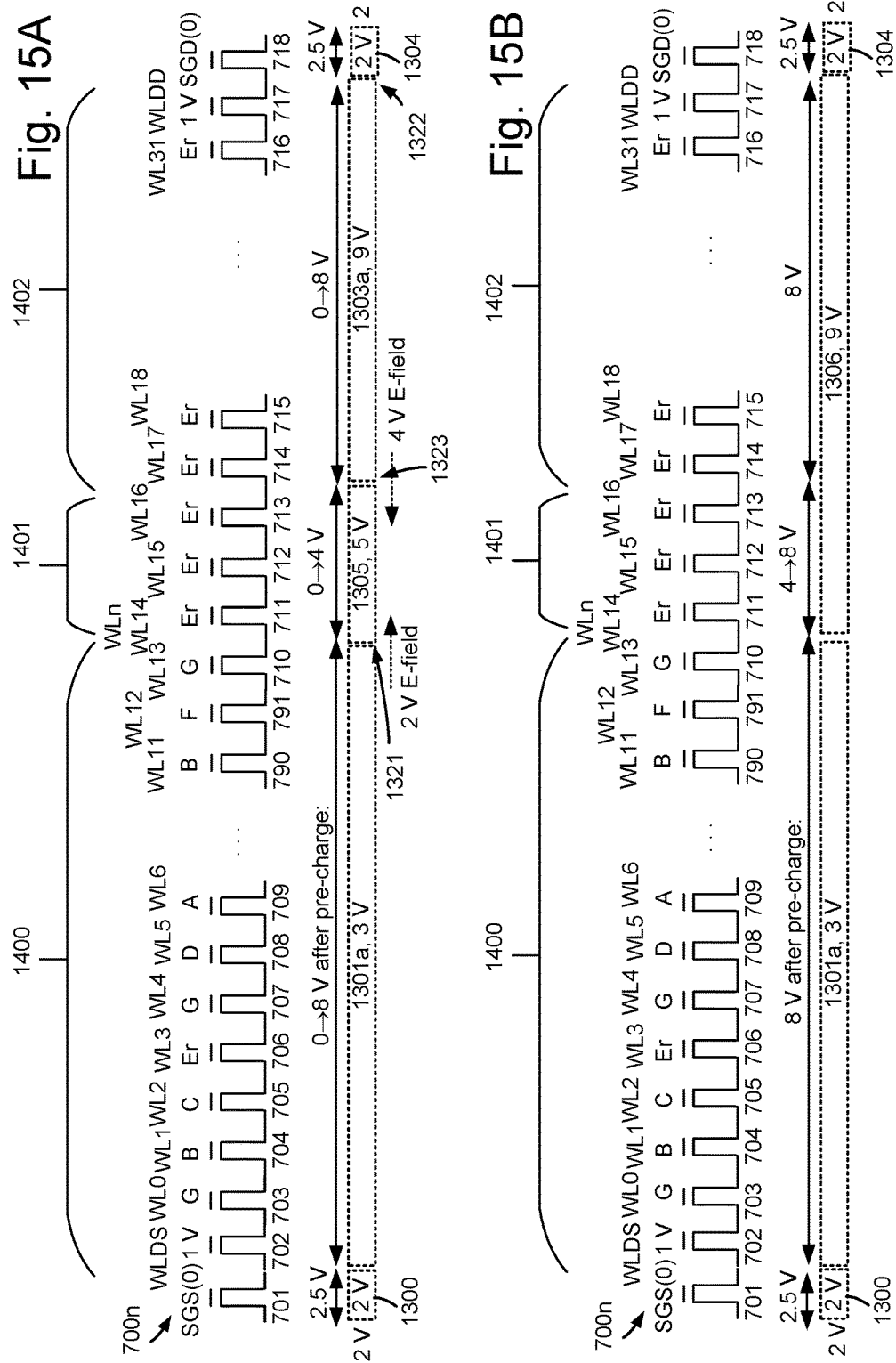

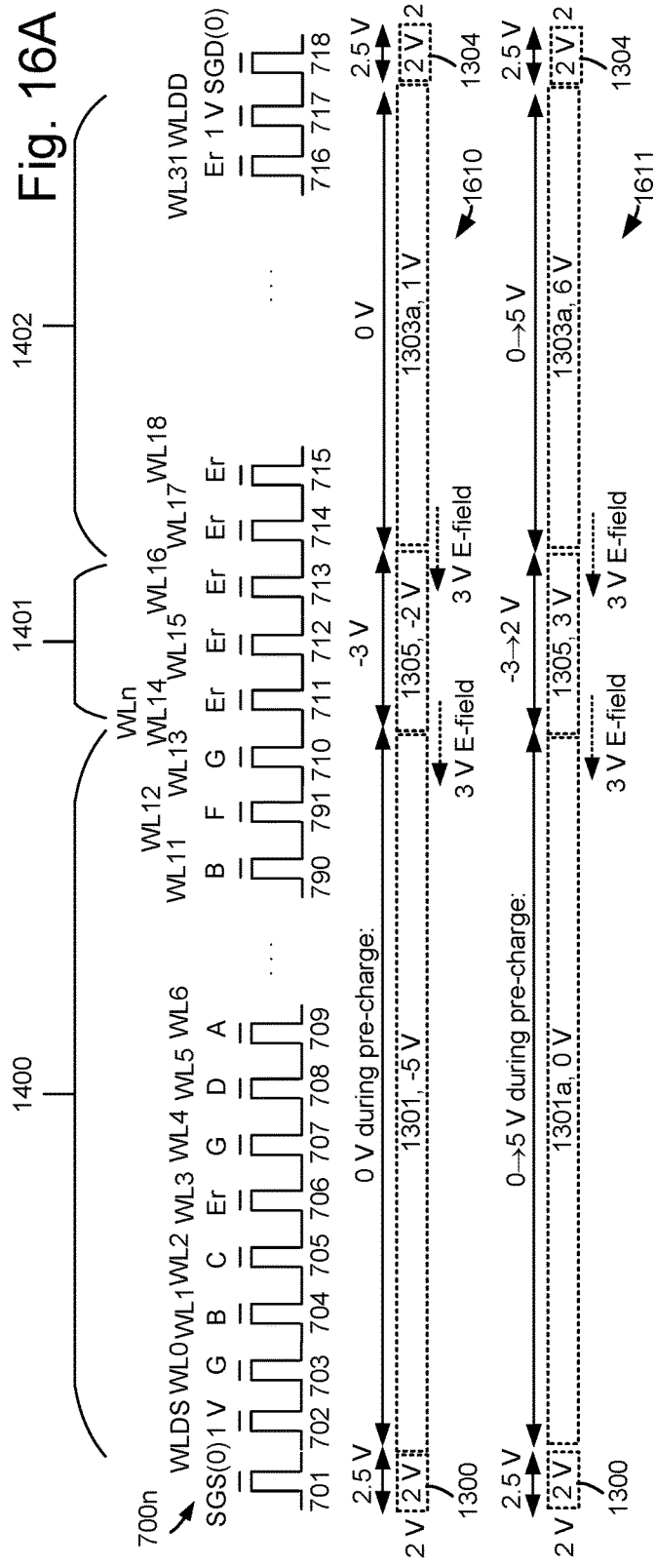

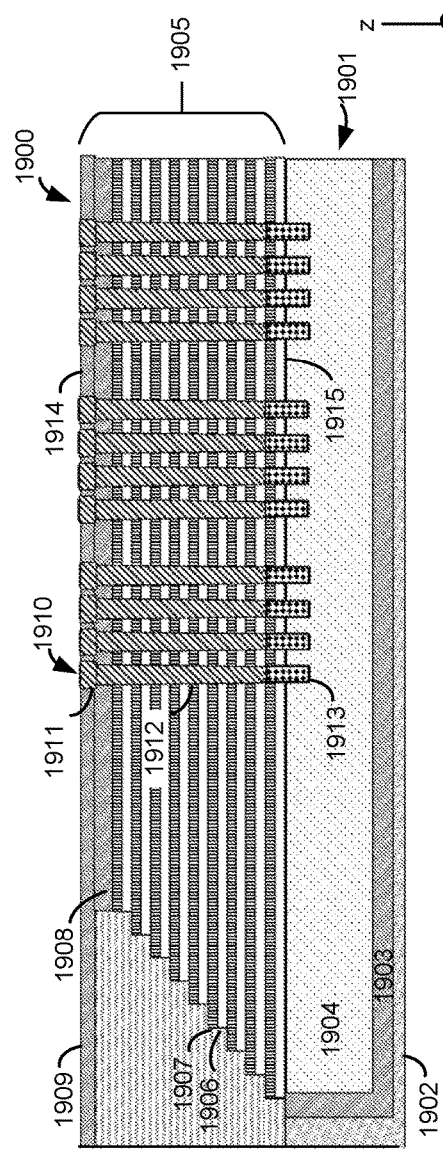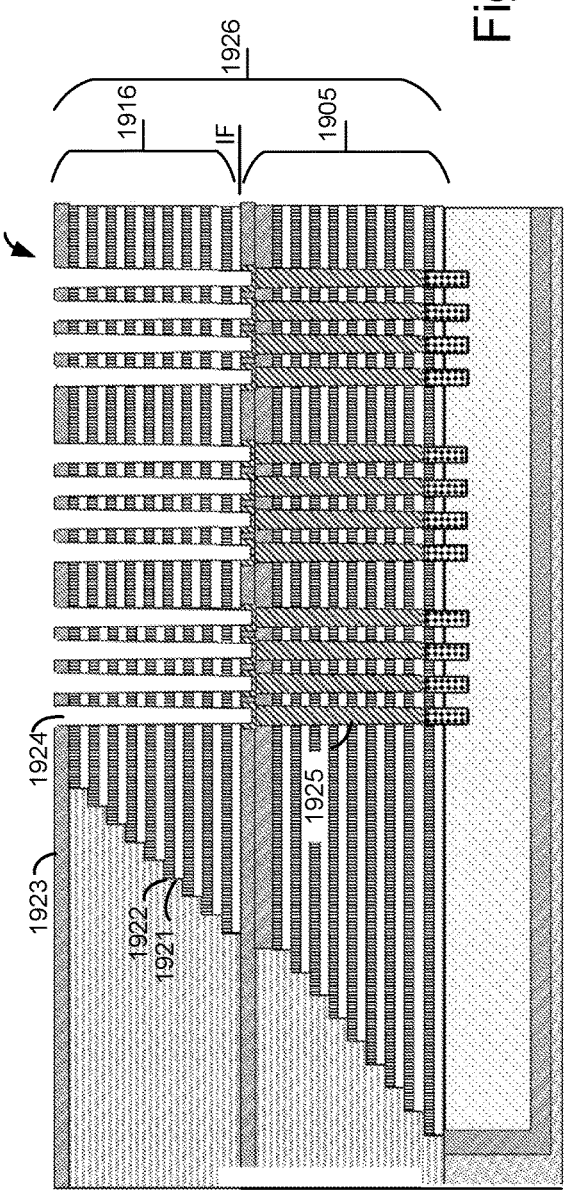

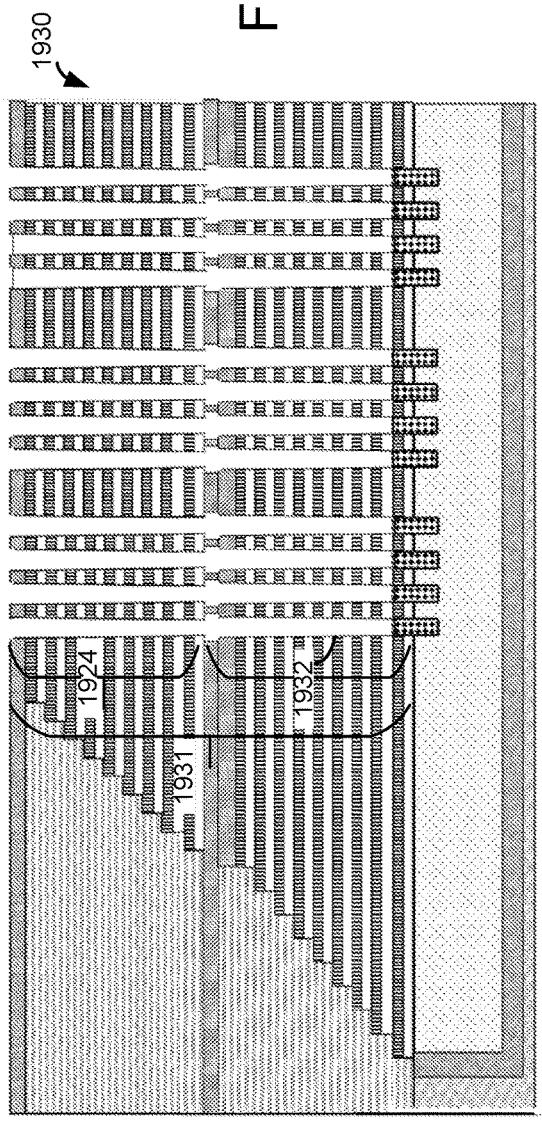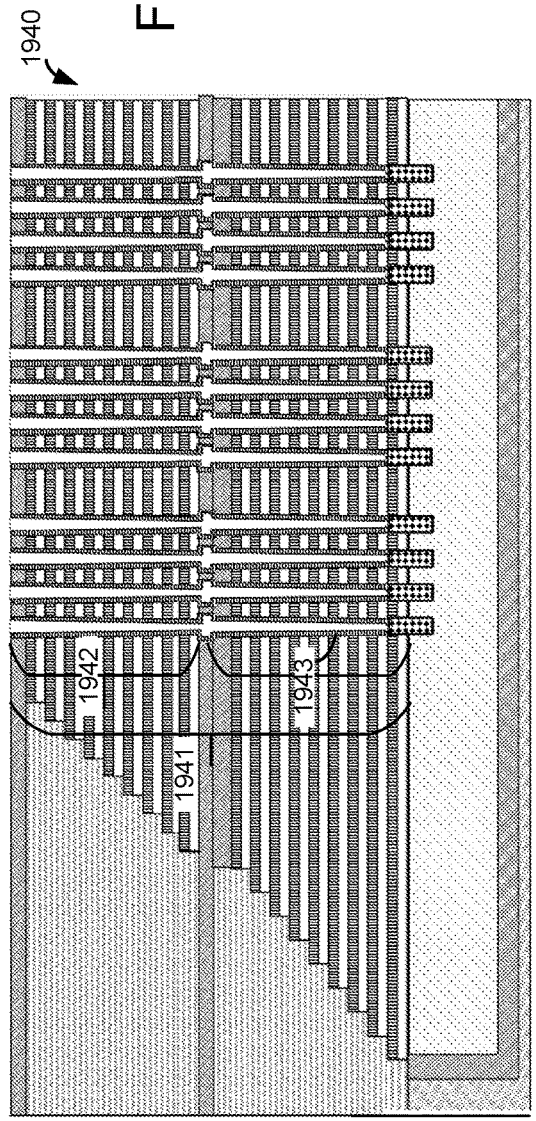

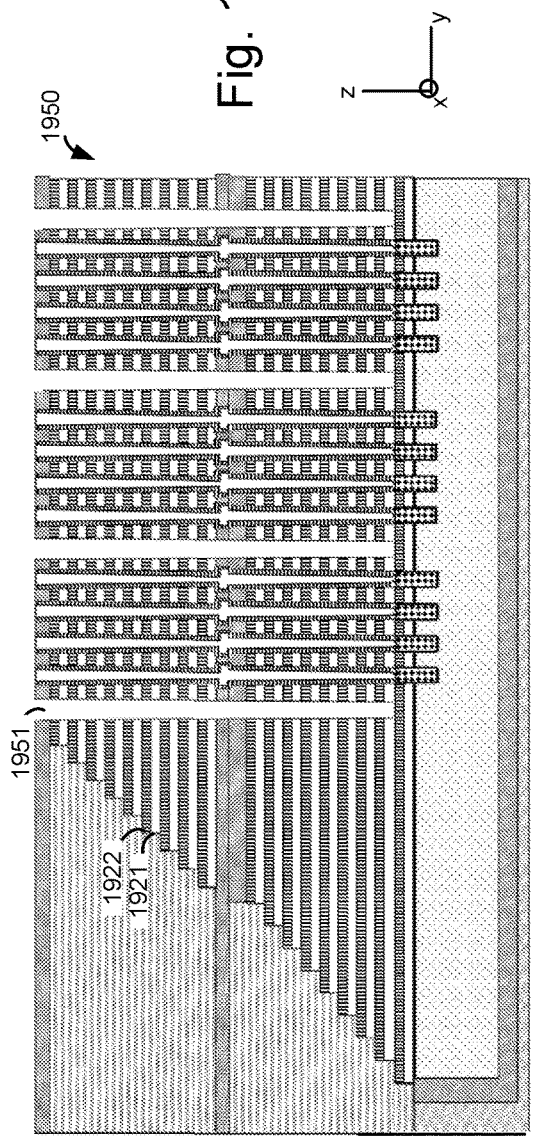
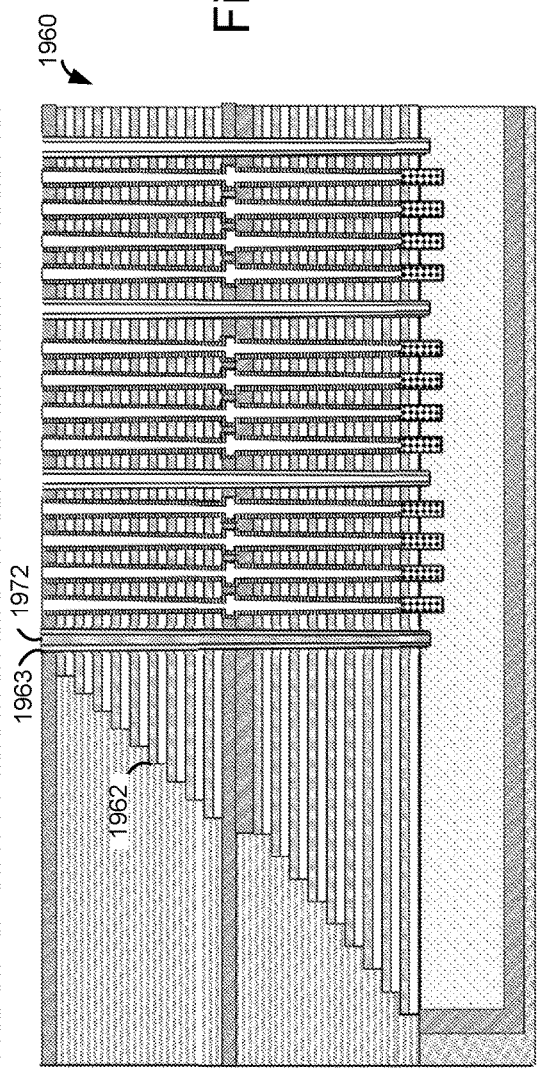

REDUCING DISTURBS WITH DELAYED RAMP UP OF SELECTED WORD LINE VOLTAGE AFTER PRE-CHARGE DURING PROGRAMMING

BACKGROUND

The present technology relates to the operation of memory devices.

Semiconductor memory devices have become more popular for use in various electronic devices. For example, non-volatile semiconductor memory is used in cellular telephones, digital cameras, personal digital assistants, mobile computing devices, non-mobile computing devices and other devices.

A charge-storing material such as a floating gate or a charge-trapping material can be used in such memory devices to store a charge which represents a data state. A charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers.

A memory device includes memory cells which may be arranged in series, in NAND strings, for instance, where select gate transistors are provided at the ends of the NAND string to selectively connect a channel of the NAND string to a source line or bit line. However, various challenges are presented in operating such memory devices.

BRIEF DESCRIPTION OF THE DRAWINGS

FIG. 6A depicts an example cross-sectional view of a portion of one of the blocks of FIG. 5.

FIG. 6B depicts an example transistor 650.

FIG. 9A depicts an example threshold voltage (Vth) distribution of a set of memory cells connected to a selected word line after a programming operation, where four data states are used.

FIG. 9B depicts an example Vth distribution of the set of memory cells of FIG. 9A, showing the effects of hot electron injection type of disturb.

FIG. 9C depicts an example Vth distribution of a set of memory cells connected to a selected word line after a programming operation, where eight data states are used.

FIG. 11 depicts a series of program loops in an example programming operation, consistent with FIG. 10A.

FIG. 12A depicts examples of plots of voltages which can be used in a program loop of a program operation, consistent with FIG. 10A.

FIG. 14A depicts voltages in a channel of the string 700n of FIG. 7, after a pre-charge operation, in a second example in which voltages of a first group of adjacent word lines comprising WLn and one or more drain-side word lines of WLn are increased after voltages of remaining word lines are increased, consistent with step 1004a of FIG. 11.

FIG. 14B depicts voltages in a channel in a continuation of FIG. 14A after the pre-charge operation.

FIG. 15A depicts voltages in a channel of the string 700n of FIG. 7, after a pre-charge operation, in a third example in which voltages of the first group of adjacent word lines are increased in steps while voltages of remaining word lines are continuously increased, consistent with step 1004b of FIG. 11.

FIG. 15B depicts voltages in a channel in a continuation of FIG. 15A after the pre-charge operation.

FIG. 16A depicts voltages in a channel of the string 700n of FIG. 7, during a pre-charge operation, in a fourth example in which voltages of the first group of adjacent word lines are increased from a negative voltage while voltages of remaining word lines are increased from 0 V, consistent with step 1003a of FIG. 11.

FIG. 19A depicts a semiconductor structure in a configuration which is consistent with steps 1800 and 1801 of FIG. 18.

FIG. 19B depicts a semiconductor structure in a configuration which is consistent with steps 1802 and 1803 of FIG. 18.

FIG. 19C depicts a semiconductor structure in a configuration which is consistent with step 1804 of FIG. 18.

FIG. 19D depicts a semiconductor structure in a configuration which is consistent with step 1805 of FIG. 18.

FIG. 19E depicts a semiconductor structure in a configuration which is consistent with step 1806 of FIG. 18.

FIG. 19F depicts a semiconductor structure in a configuration which is consistent with steps 1807 and 1808 of FIG. 18.

DETAILED DESCRIPTION

Figure 1:
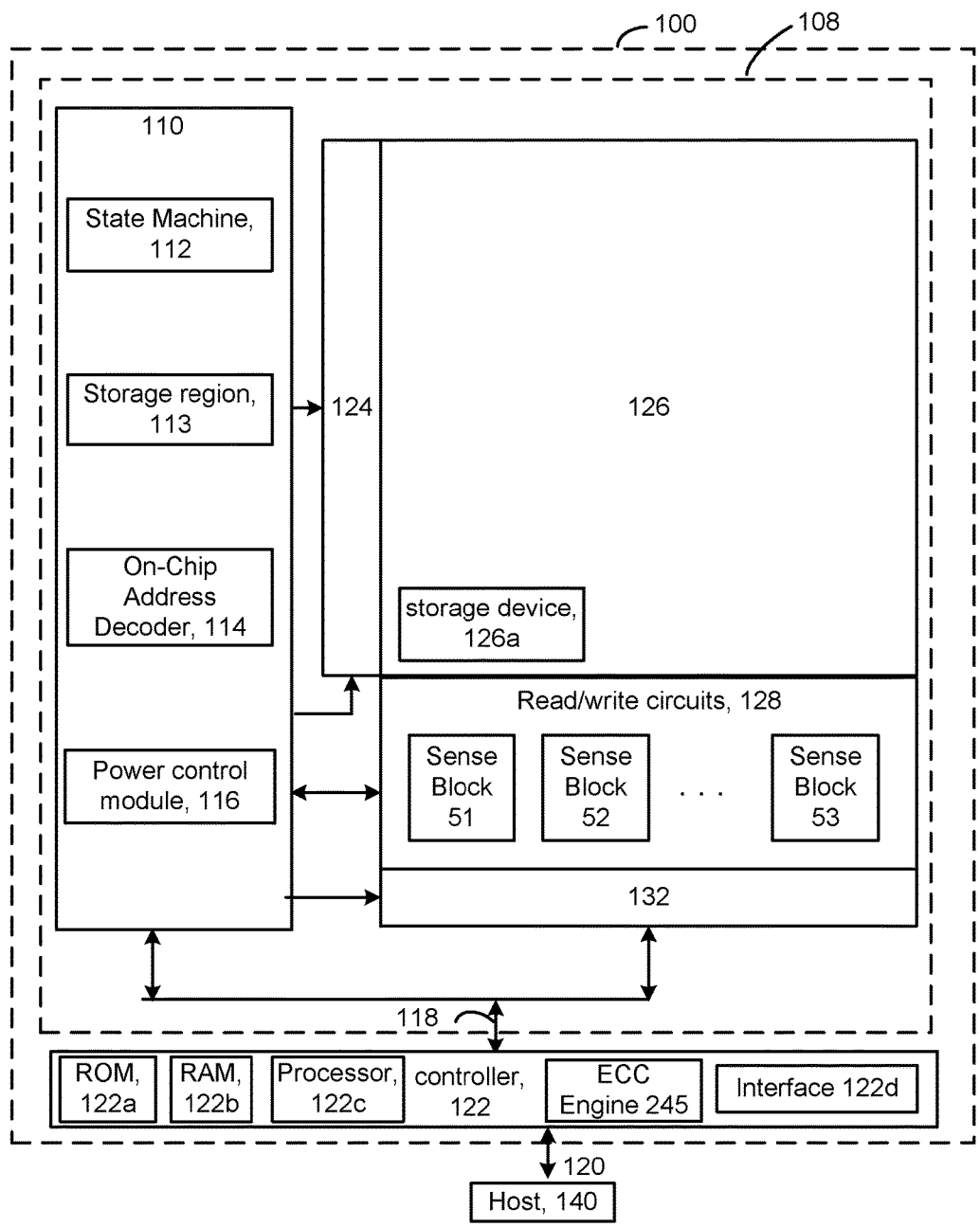
FIG. 1 is a block diagram of an example memory device.

Apparatuses and techniques are described for reducing disturbs of memory cells in a memory device.

In some memory devices, memory cells are joined to one another such as in NAND strings in a block or sub-block. Each NAND string comprises a number of memory cells connected in series between one or more drain-end select gate transistors (referred to as SGD transistors), on a drain-end of the NAND string which is connected to a bit line, and one or more source-end select gate transistors (referred to as SGS transistors), on a source-end of the NAND string or other string which is connected to a source line. Further, the memory cells can be arranged with a common control gate line (e.g., word line) which acts a control gate. A set of word lines extends from the source-side of a block to the drain-side of a block. Memory cells can be connected in other types of strings and in other ways as well.

In a 3D memory structure, the memory cells may be arranged in vertical strings in a stack, where the stack comprises alternating conductive and dielectric layers. The conductive layers act as word lines which are connected to the memory cells. Each string may have the shape of a pillar which intersects with the word lines to form the memory cells.

The memory cells can include data memory cells, which are eligible to store user data, and dummy or non-data memory cells which are ineligible to store user data. A dummy word line is connected to a dummy memory cell. One or more dummy memory cells may be provided at the drain and/or source ends of a NAND string of memory cells to provide a gradual transition in a voltage of a channel of the string.

During a programming operation, the memory cells are programmed according to a word line programming order. For example, the programming may start at the word line at the source-side of the block and proceed to the word line at the drain-side of the block. In one approach, each word line is completely programmed before programming a next word line. For example, a first word line, WL0, is programmed using one or more programming passes until the programming is completed. Next, a second word line, WL1, is programmed using one or more programming passes until the programming is completed, and so forth. A programming pass may include a set of increasing program voltages which are applied to the word line in respective program loops or program-verify iterations, such as depicted in FIG. 14. Verify operations may be performed after each program voltage to determine whether the memory cells have completed programming. When programming is completed for a memory cell, it can be locked out from further programming while programming continues for other memory cells in subsequent program loops.

The memory cells may also be programmed according to a sub-block programming order, where memory cells connected to a word line are programmed in one sub-block, then a next sub-block and so forth.

Each memory cell may be associated with a data state according to write data in a program command. Based on its data state, a memory cell will either remain in the erased state or be programmed to a programmed data state. For example, in a one bit per cell memory device, there are two data states including the erased state and the programmed state. In a two-bit per cell memory device, there are four data states including the erased state and three higher data states referred to as the A, B and C data states (see FIG. 9A). In a three-bit per cell memory device, there are eight data states including the erased state and seven higher data states referred to as the A, B, C, D, E, F and G data states (see FIG. 9C). In a four-bit per cell memory device, there are sixteen data states including the erased state and fifteen higher data states. The data states may be referred to as the S0-S15 data states where S0 is the erased state.

After the memory cells are programmed, the data can be read back in a read operation. A read operation can involve applying a series of read voltages to a word line while sensing circuitry determines whether cells connected to the word line are in a conductive or non-conductive state. If a memory cell is in a non-conductive state, the Vth of the memory cell exceeds the read voltage. The read voltages are set at levels which are expected to be between the threshold voltage levels of adjacent data states. During the read operation, the voltages of the unselected word lines are ramped up to a read pass level which is high enough to place the unselected data and dummy memory cells in a strongly conductive state, to avoid interfering with the sensing of the selected memory cells.

However, it has been observed that the Vth of the memory cells can increase over time due to disturbs. Specifically, after a verify test at the end of a program loop for a selected word line WLn, the word line voltages are ramped down to a steady state voltage Vss such as 0 V. See FIG. 12A, plot 1210 at t12. However, due to the word line programming order, the memory cells in the word lines on the source-side of WLn, e.g., WL0-WLn−1 will include programmed memory cells with an elevated Vth. As the word line voltages decrease below the Vth, the channels of the string can be cutoff (made non-conductive). This can result in a lower channel voltage on the source-side of WLn than on the drain-side. See also FIG. 13A at channel region 1301 (−5 V) compared to channel region 1303 (1 V). This voltage differential remains, and is made worse, during the pre-charge operation of the next program loop. See FIG. 13A at channel region 1301 (3 V) compared to channel region 1303 (9 V).

This differential continues in the next program loop, when a pre-charge operation is performed. See FIG. 12A at t0-t2. After the pre-charge operation, the voltages of the word lines are ramped up to boost the channel voltages of the unselected strings by capacitive coupling. See FIG. 12A at t2. When the voltages are sufficiently high, the channels are no longer cutoff and a channel gradient is created adjacent to the memory cells of WLn.

The channel gradient generates electron-hole pairs, where the electrons can travel into the charge trapping region of the memory cells of WLn, in a process referred to as a hot electron injection (HEI) type of disturb. See FIG. 13B which shows a disturb of the memory cell 711. These disturbs can accumulate over time and increase the Vth of the memory cells above an acceptable level, especially for the erased state memory cells. See FIG. 9B. The disturb typically occurs for the memory cells which are connected to WLn but are not selected for programming in the current program loop. These are unselected memory cells in unselected strings.

Techniques provided herein address the above and other issues. In one approach, after the pre-charge operation, voltages of a first group of adjacent word lines comprising WLn and one or more drain-side word lines of WLn are increased after voltages of remaining word lines are increased. For example, see the group 1401 in FIG. 14A. See also the delayed increase of FIG. 12A at plot 1210. In another approach, after the pre-charge operation, voltages of the first group of adjacent word lines are increased in steps while voltages of remaining word lines are continuously increased. See the stepped increase of FIG. 12B at plot 1240. In another approach, voltages of the first group of adjacent word lines are increased from a negative voltage while voltages of remaining word lines are increased from 0 V. See the negative voltage of FIG. 12B at plot 1260. These approaches modify a timing and/or a respective initial voltage of the increase of the word lines to reduce a channel gradient which can lead to disturbs.

In another aspect, the disturb countermeasures can be implemented according to the position of WLn in a multi-tier stack. For example, the disturb countermeasures can be implemented when WLn is in the upper tier of the stack but not the lower tier. As described in connection with FIGS. 17A and 17B, channel gradients are reduced when WLn is in the lower tier due to an interface between the tiers.

These and other features are discussed further below.

FIG. 1 is a block diagram of an example memory device. The memory device 100, such as a non-volatile storage system, may include one or more memory die 108. The memory die 108 includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks 51, 52, . . . 53 (sensing circuitry) and allow a page of memory cells to be read or programmed in parallel. Typically a controller 122 is included in the same memory device 100 (e.g., a removable storage card) as the one or more memory die 108. The controller may be separate from the memory die. Commands and data are transferred between the host 140 and controller 122 via a data bus 120, and between the controller and the one or more memory die 108 via lines 118.

The memory structure can be 2D or 3D. The memory structure may comprise one or more array of memory cells including a 3D array. The memory structure may comprise a monolithic 3D memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112, an on-chip address decoder 114 and a power control module 116. The power control module can include voltage sources such as discussed in connection with FIG. 4.

The state machine 112 provides chip-level control of memory operations. A storage region 113 may be provided, e.g., for operational parameters and software/code. In one embodiment, the state machine is programmable by the software. In other embodiments, the state machine does not use software and is completely implemented in hardware (e.g., electrical circuits).

The on-chip address decoder 114 provides an address interface between that used by the host or a memory controller to the hardware address used by the decoders 124 and 132. The power control module 116 controls the power and voltages supplied to the word lines, select gate lines, bit lines and source lines during memory operations. It can include drivers for data and dummy word lines, SGS and SGD transistors and source lines. See also the drivers FIG. 4. The sense blocks can include bit line drivers, in one approach.

In some implementations, some of the components can be combined. In various designs, one or more of the components (alone or in combination), other than memory structure 126, can be thought of as at least one control circuit which is configured to perform the techniques described herein including the steps of the processes described herein. For example, a control circuit may include any one of, or a combination of, control circuitry 110, state machine 112, decoders 114 and 132, power control module 116, sense blocks 51, 52, . . . , 53, read/write circuits 128, controller 122, and so forth.

The off-chip controller 122 (which in one embodiment is an electrical circuit) may comprise a processor 122c, storage devices (memory) such as ROM 122a and RAM 122b and an error-correction code (ECC) engine 245. The ECC engine can correct a number of read errors.

A memory interface 122d may also be provided. The memory interface, in communication with ROM, RAM and processor, is an electrical circuit that provides an electrical interface between controller and memory die. For example, the memory interface can change the format or timing of signals, provide a buffer, isolate from surges, latch I/O and so forth. The processor can issue commands to the control circuitry 110 (or any other component of the memory die) via the memory interface 122d.

The storage device comprises code such as a set of instructions, and the processor is operable to execute the set of instructions to provide the functionality described herein. Alternatively or additionally, the processor can access code from a storage device 126a of the memory structure, such as a reserved area of memory cells in one or more word lines.

For example, code can be used by the controller to access the memory structure such as for programming, read and erase operations. The code can include boot code and control code (e.g., a set of instructions). The boot code is software that initializes the controller during a booting or startup process and enables the controller to access the memory structure. The code can be used by the controller to control one or more memory structures. Upon being powered up, the processor 122c fetches the boot code from the ROM 122a or storage device 126a for execution, and the boot code initializes the system components and loads the control code into the RAM 122b. Once the control code is loaded into the RAM, it is executed by the processor. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below, and provide the voltage waveforms including those discussed further below. A control circuit can be configured to execute the instructions to perform the functions described herein.

In one embodiment, the host is a computing device (e.g., laptop, desktop, smartphone, tablet, digital camera) that includes one or more processors, one or more processor readable storage devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and select gate transistors.

A NAND memory array may be configured so that the array is composed of multiple strings of memory in which a NAND string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a 2D memory structure or a 3D memory structure.

In a 2D memory structure, the semiconductor memory elements are arranged in a single plane or a single memory device level. Typically, in a 2D memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A 3D memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a 3D memory structure may be vertically arranged as a stack of multiple 2D memory device levels. As another non-limiting example, a 3D memory array may be arranged as multiple vertical columns (e.g., columns extending substantially perpendicular to the major surface of the substrate, i.e., in the y direction) with each column having multiple memory elements. The columns may be arranged in a 2D configuration, e.g., in an x-y plane, resulting in a 3D arrangement of memory elements with elements on multiple vertically stacked memory planes. Other configurations of memory elements in three dimensions can also constitute a 3D memory array.

By way of non-limiting example, in a 3D NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other 3D configurations can be envisioned wherein some NAND strings contain memory elements in a single memory level while other strings contain memory elements which span through multiple memory levels. 3D memory arrays may also be designed in a NOR configuration and in a ReRAM configuration.

Typically, in a monolithic 3D memory array, one or more memory device levels are formed above a single substrate. Optionally, the monolithic 3D memory array may also have one or more memory layers at least partially within the single substrate. As a non-limiting example, the substrate may include a semiconductor such as silicon. In a monolithic 3D array, the layers constituting each memory device level of the array are typically formed on the layers of the underlying memory device levels of the array. However, layers of adjacent memory device levels of a monolithic 3D memory array may be shared or have intervening layers between memory device levels.

2D arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic 3D memory arrays. Further, multiple 2D memory arrays or 3D memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the 2D and 3D exemplary structures described but covers all relevant memory structures within the spirit and scope of the technology as described herein and as understood by one of skill in the art.

Figure 2:
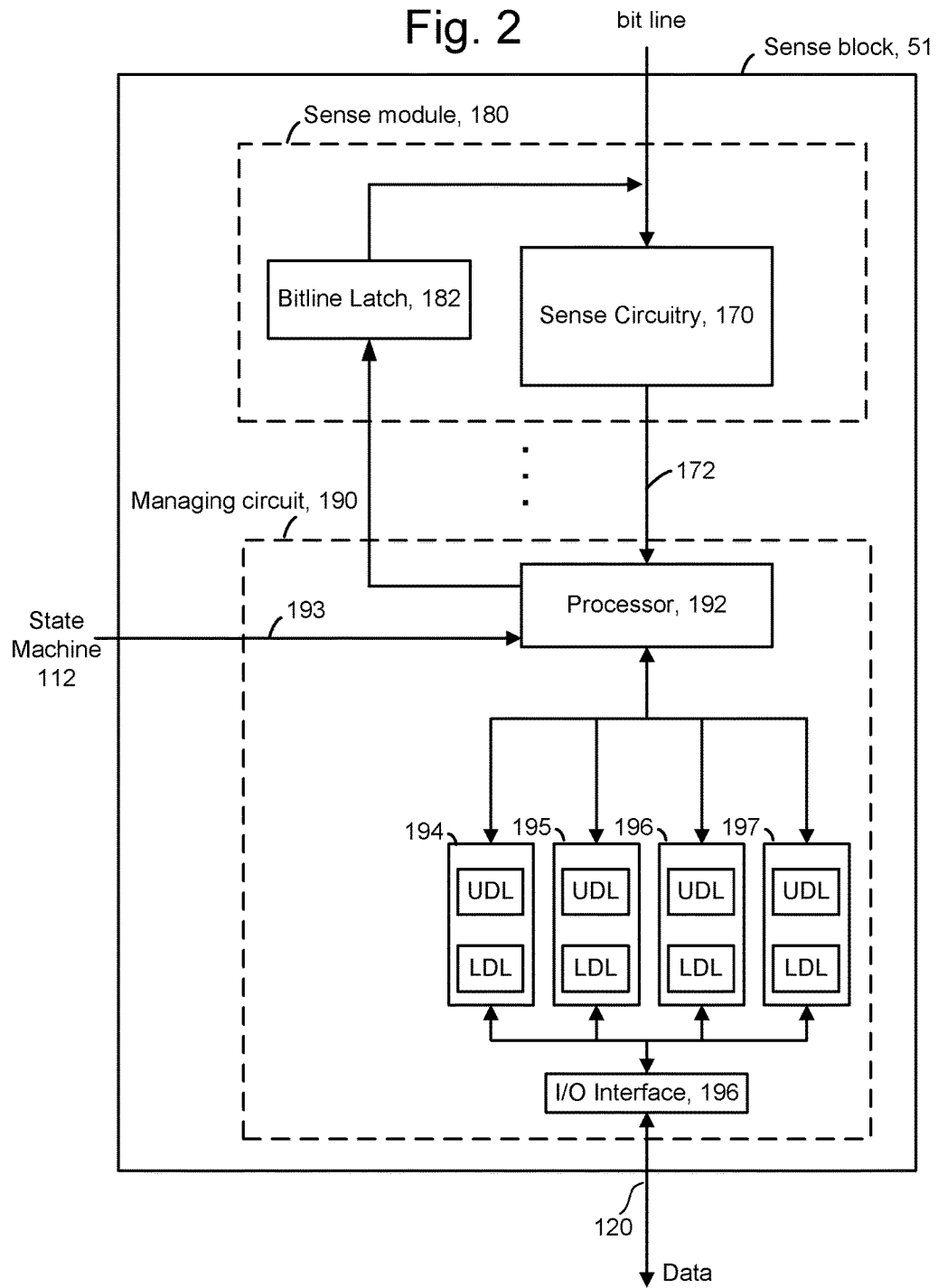
FIG. 2 is a block diagram depicting one embodiment of the sense block 51 of FIG. 1.

FIG. 2 is a block diagram depicting one embodiment of the sense block 51 of FIG. 1. An individual sense block 51 is partitioned into one or more core portions, referred to as sense modules 180 or sense amplifiers, and a common portion, referred to as a managing circuit 190. In one embodiment, there will be a separate sense module 180 for each bit line and one common managing circuit 190 for a set of multiple, e.g., four or eight, sense modules 180. Each of the sense modules in a group communicates with the associated managing circuit via data bus 172. Thus, there are one or more managing circuits which communicate with the sense modules of a set of storage elements.

Sense module 180 comprises sense circuitry 170 that performs sensing by determining whether a conduction current in a connected bit line is above or below a predetermined threshold level. Sense module 180 also includes a bit line latch 182 that is used to set a voltage condition on the connected bit line. For example, a predetermined state latched in bit line latch 182 will result in the connected bit line being pulled to a state designating program inhibit (e.g., 1.5-3 V). As an example, a flag=0 can inhibit programming, while flag=1 does not inhibit programming.

Managing circuit 190 comprises a processor 192, four example sets of data latches 194-197 and an I/O Interface 196 coupled between the set of data latches 194 and data bus 120. One set of data latches can be provide for each sense module, and data latches identified by LDL and UDL may be provided for each set. In some cases, additional data latches may be used. LDL stores a bit for a lower page of data, and UDL stores a bit for an upper page of data. This is in a four-level or two-bits per storage element memory device. One additional data latch per bit line can be provided for each additional data bit per storage element.

Processor 192 performs computations, such as to determine the data stored in the sensed storage element and store the determined data in the set of data latches. Each set of data latches 194-197 is used to store data bits determined by processor 192 during a read operation, and to store data bits imported from the data bus 120 during a programming operation which represent write data meant to be programmed into the memory. I/O interface 196 provides an interface between data latches 194-197 and the data bus 120.

During reading, the operation of the system is under the control of state machine 112 that controls the supply of different control gate voltages to the addressed storage element. As it steps through the various predefined control gate voltages corresponding to the various memory states supported by the memory, the sense module 180 may trip at one of these voltages and a corresponding output will be provided from sense module 180 to processor 192 via bus 172. At that point, processor 192 determines the resultant memory state by consideration of the tripping event(s) of the sense module and the information about the applied control gate voltage from the state machine via input lines 193. It then computes a binary encoding for the memory state and stores the resultant data bits into data latches 194-197. In another embodiment of the managing circuit 190, bit line latch 182 serves double duty, both as a latch for latching the output of the sense module 180 and also as a bit line latch as described above.

Some implementations can include multiple processors 192. In one embodiment, each processor 192 will include an output line (not depicted) such that each of the output lines is wired-OR'd together. In some embodiments, the output lines are inverted prior to being connected to the wired-OR line. This configuration enables a quick determination during the program verification process of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense modules, the state machine needs to read the wired-OR line eight times, or logic is added to processor 192 to accumulate the results of the associated bit lines such that the state machine need only read the wired-OR line one time. Similarly, by choosing the logic levels correctly, the global state machine can detect when the first bit changes its state and change the algorithms accordingly.

During program or verify operations, the data to be programmed (write data) is stored in the set of data latches 194-197 from the data bus 120, in the LDL and UDL latches, in a two-bit per storage element implementation. In a three-bit per storage element implementation, an additional data latch may be used. The programming operation, under the control of the state machine, comprises a series of programming voltage pulses applied to the control gates of the addressed storage elements. Each program pulse is followed by a read back (verify) to determine if the storage element has been programmed to the desired memory state. In some cases, processor 192 monitors the read back memory state relative to the desired memory state. When the two are in agreement, the processor 192 sets the bit line latch 182 so as to cause the bit line to be pulled to a state designating program inhibit. This inhibits the storage element coupled to the bit line from further programming even if program pulses appear on its control gate. In other embodiments the processor initially loads the bit line latch 182 and the sense circuitry sets it to an inhibit value during the verify process.

Each set of data latches 194-197 may be implemented as a stack of data latches for each sense module. In one embodiment, there are three data latches per sense module 180. In some implementations, the data latches are implemented as a shift register so that the parallel data stored therein is converted to serial data for data bus 120, and vice versa. All the data latches corresponding to the read/write block of storage elements can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

The data latches identify when an associated storage element has reached certain mileposts in a programming operations. For example, latches may identify that a storage element's Vth is below a particular verify level. The data latches indicate whether a storage element currently stores one or more bits from a page of data. For example, the LDL latches can be used to store a lower page of data. An LDL latch is flipped (e.g., from 0 to 1) when a lower page bit is stored in an associated storage element. A UDL latch is flipped when an upper page bit is stored in an associated storage element. This occurs when an associated storage element completes programming, e.g., when its Vth exceeds a target verify level such as VvA, VvB or VvC.

Figure 3:
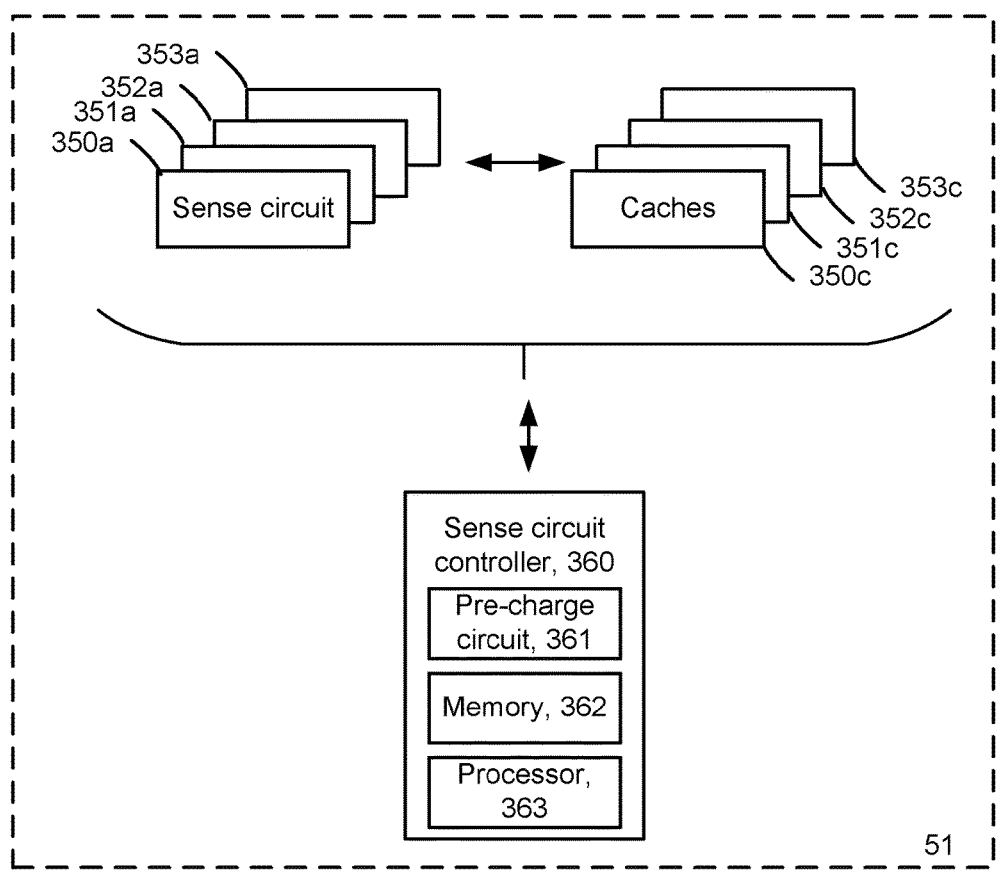
FIG. 3 depicts another example block diagram of the sense block 51 of FIG. 1.

FIG. 3 depicts another example block diagram of the sense block 51 of FIG. 1. The column control circuitry can include multiple sense blocks, where each sense block performs sensing, e.g., read, program verify or erase verify operations for multiple memory cells via respective bit lines. In one approach, a sense block comprises multiple sense circuits, also referred to as sense amplifiers. Each sense circuit is associated with data latches and caches. For example, the example sense circuits 350a, 351a, 352a and 353a are associated with caches 350c, 351c, 352c and 353c, respectively.

In one approach, different subsets of bit lines can be sensed using different respective sense blocks. This allows the processing load which is associated with the sense circuits to be divided up and handled by a respective processor in each sense block. For example, a sense circuit controller 360 can communicate with the set, e.g., sixteen, of sense circuits and latches. The sense circuit controller may include a pre-charge circuit 361 which provides a voltage to each sense circuit for setting a pre-charge voltage. The sense circuit controller may also include a memory 362 and a processor 363.

Figure 4:
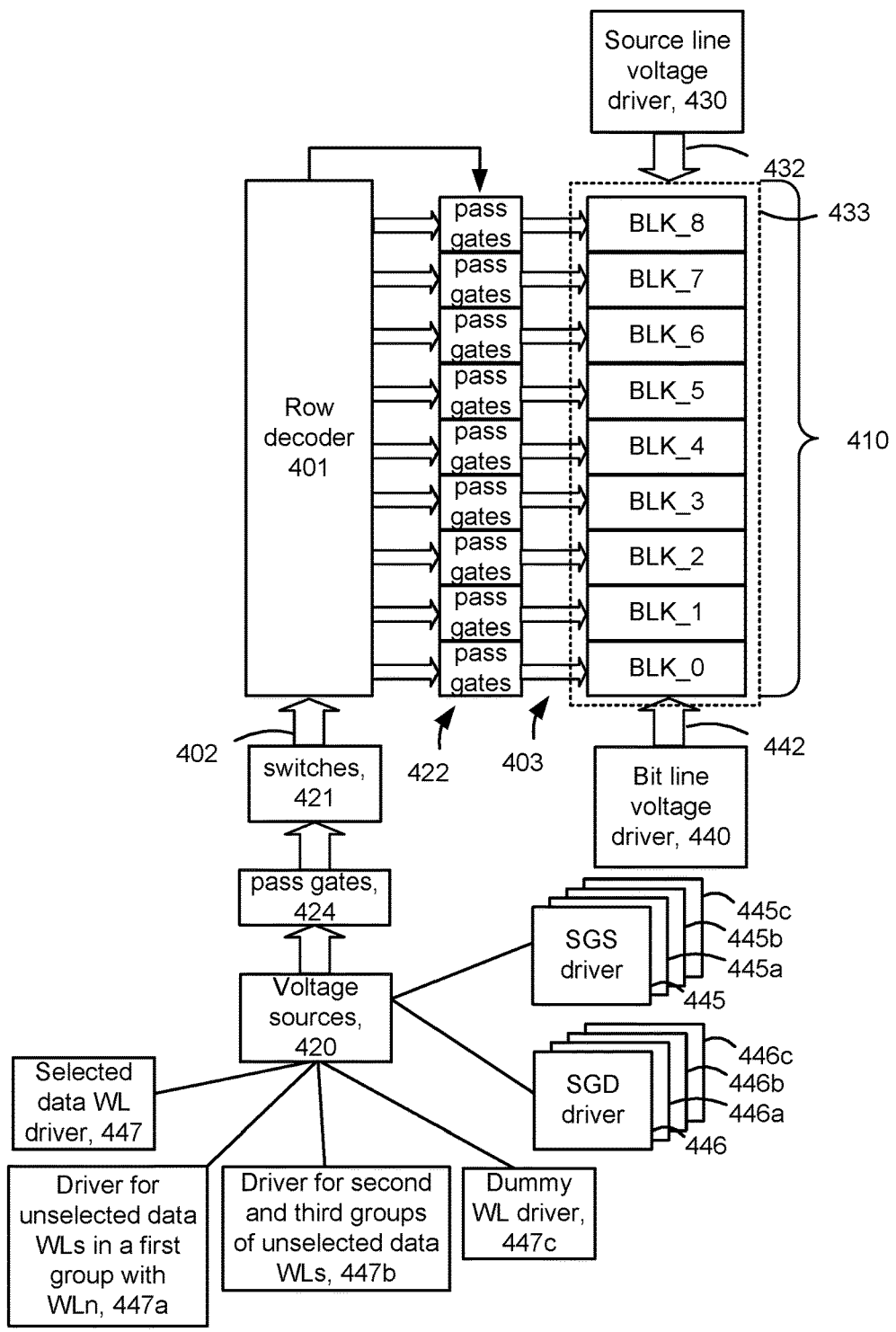
FIG. 4 depicts an example circuit for providing voltages to blocks of memory cells.

FIG. 4 depicts an example circuit for providing voltages to blocks of memory cells. In this example, a row decoder 401 provides voltages to word lines and select gates of each block in set of blocks 410. The blocks could be in a plane and includes blocks BLK_0 to BLK_8. The row decoder provides a control signal to pass gates 422 which connect the blocks to the row decoder. Typically, program or read operations are performed on one selected block at a time and on one selected sub-block of the block. An erase operation may be performed on a selected block or sub-block. The row decoder can connect global control lines 402 to local control lines 403. The control lines represent conductive paths. Voltages are provided on the global control lines from voltage sources 420. The voltage sources may provide voltages to switches 421 which connect to the global control lines. Pass gates 424, also referred to as pass transistors or transfer transistors, are controlled to pass voltages from the voltage sources 420 to the switches 421.

The voltage sources 420 can provide voltages on word lines (WL), SGS control gates and SGD control gates, for example. The voltage sources can include a selected word line (WL) driver 447, which provides a voltage on a word line selected during a program or read operation, a driver 447a for unselected data word lines in a first group of adjacent word lines (which includes WLn; see example group 1401 in FIG. 14A) a driver 447b for a second group of unselected data word lines (which could be a group of word lines on a drain-side of the first group; see example group 1402 in FIG. 14A) and for a third group of unselected data word lines (which could be a group of word lines on a source-side of WLn; see example group 1400 in FIG. 14A) and a dummy word line driver 447c which provides voltages on dummy word lines.

The voltage sources can also include separate SGS and SGD drivers for each sub-block. For example, SGS drivers 445, 445a, 445b and 445c, and SGD drivers 446, 446a, 446b and 446c can be provided for SB0, SB1, SB2 and SB3, respectively, such as in FIGS. 7 and 8. In another option, one SGS driver is common to the different sub-blocks in a block.

The various components, including the row decoder, may receive commands from a controller such as the state machine 112 or the controller 122 to perform the functions described herein.

A source line voltage source 430 provides the voltage Vsl to the source lines/diffusion region in the substrate via control lines 432. In one approach, the source diffusion region 433 is common to the blocks. A set of bit lines 442 is also shared by the blocks. A bit line voltage source 440 provides voltages to the bit lines.

Figure 5:
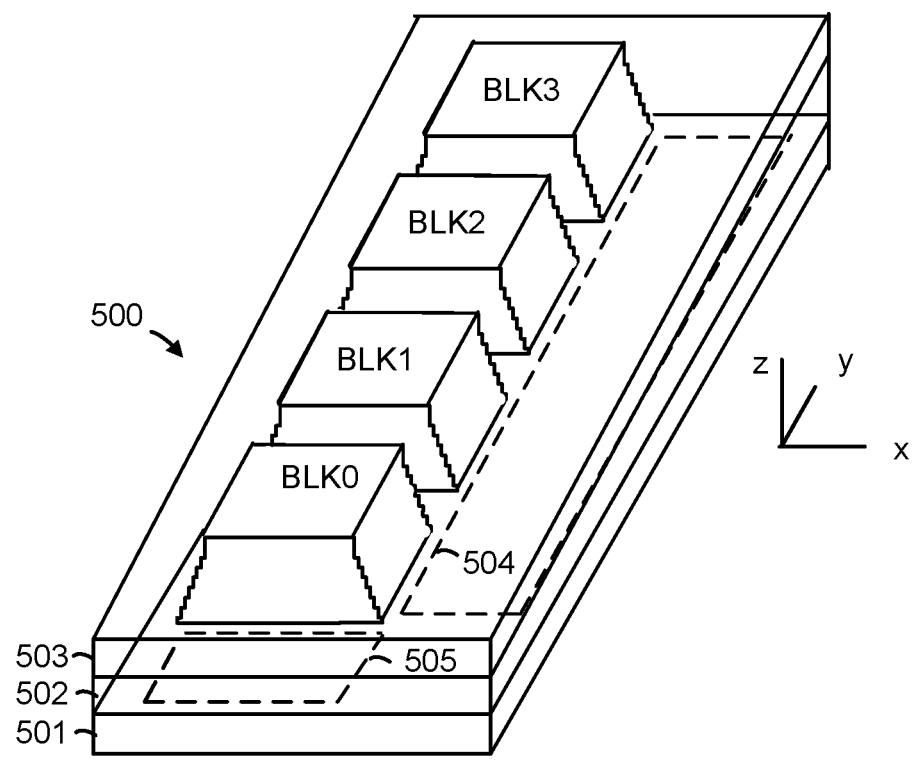
FIG. 5 is a perspective view of a memory device 500 comprising a set of blocks in an example 3D configuration of the memory structure 126 of FIG. 1.

FIG. 5 is a perspective view of a memory device 500 comprising a set of blocks in an example 3D configuration of the memory structure 126 of FIG. 1. On the substrate are example blocks BLK0, BLK1, BLK2 and BLK3 of memory cells (storage elements) and peripheral areas with circuitry for use by the blocks. The peripheral area 504 runs along an edge of each block while the peripheral area 505 is at an end of the set of blocks. The pass gates for a voltage driver of the SGS transistors may be located in this peripheral area 505, in one approach. In this case, the blocks BLK0, BLK1, BLK2 and BLK3 are at progressively further distances from the pass gates. The circuitry can include voltage drivers which can be connected to control gate layers, bit lines and source lines of the blocks. In one approach, control gate layers at a common height in the blocks are commonly driven. The substrate 501 can also carry circuitry under the blocks, and one or more lower metal layers which are patterned in conductive paths to carry signals of the circuitry. The blocks are formed in an intermediate region 502 of the memory device. In an upper region 503 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While four blocks are depicted as an example, two or more blocks can be used, extending in the x- and/or y-directions.

In one possible approach, the blocks are in a plane, and the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device. The blocks could also be arranged in multiple planes.

Figure 6C:
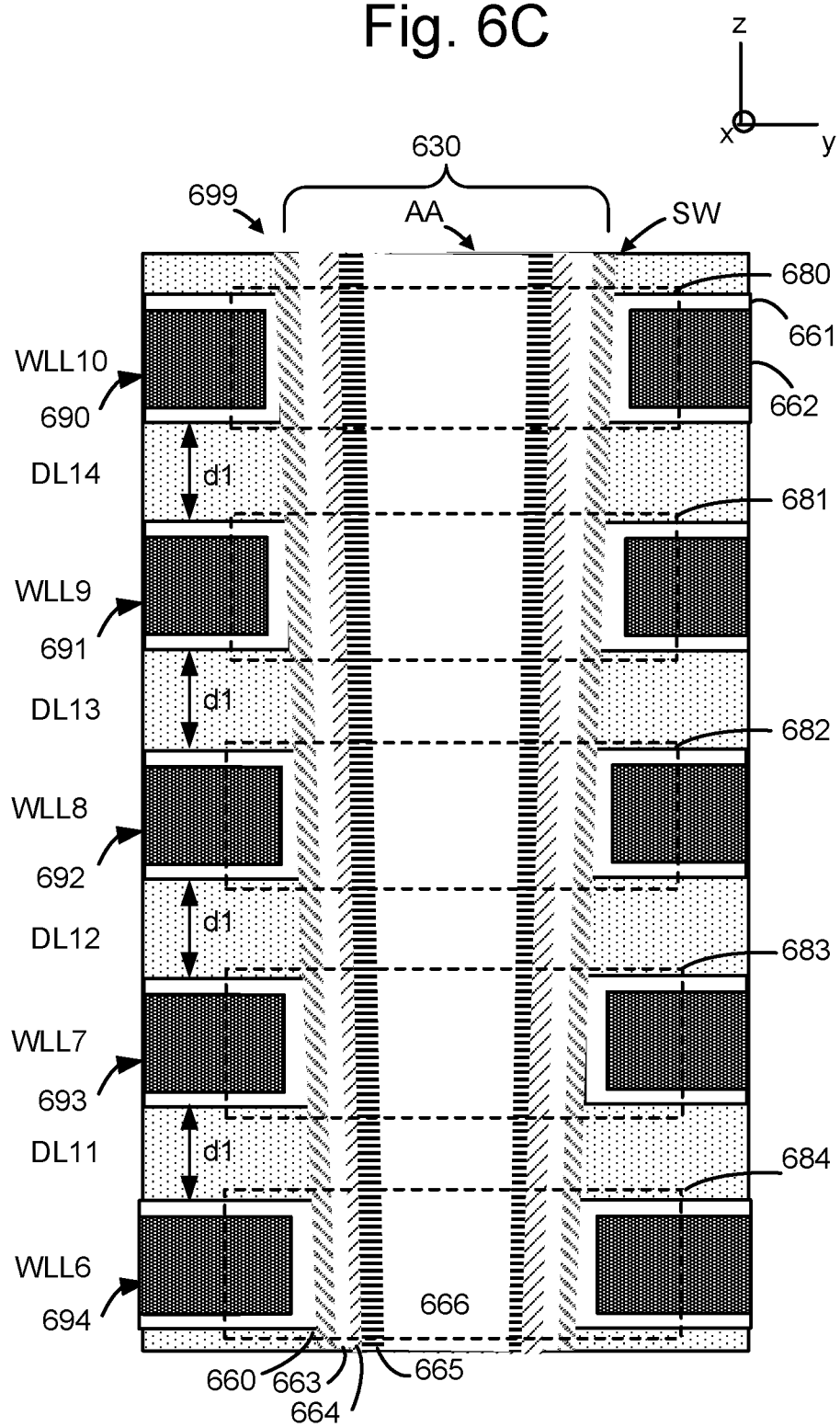
FIG. 6C depicts a close-up view of the region 622 of the stack of FIG. 6A, where the stack comprises a single tier.

FIG. 6A depicts an example cross-sectional view of a portion of one of the blocks of FIG. 5. The block comprises a stack 610 of alternating conductive and dielectric layers. In this example, the conductive layers comprise two SGD layers, one SGS layer, two source-side dummy word line layers (or word lines) WLDS1 and WLDS0, two drain-side dummy word line layers WLDD1 and WLDD0, and eleven data word line layers (or data word lines) WLL0-WLL10. WLL0 is a source-side data word line and WLDS1 is a dummy word line layer which is adjacent to the source-side data word line. WLDS0 is another dummy word line layer which is adjacent to WLDS1. WLL10 is a drain-side data word line and WLDD1 is a dummy word line layer which is adjacent to the drain-side data word line. WLDD0 is another dummy word line layer which is adjacent to WLDD1. The dielectric layers are labelled as DL1-1L19. Further, regions of the stack which comprise NAND strings NS1 and NS2 are depicted. Each NAND string encompasses a memory hole 618 or 619 which is filled with materials which form memory cells adjacent to the word lines. Region 622 of the stack is shown in greater detail in FIG. 6C.

Other configurations are possible as well. For example, the strings of FIG. 7 have 32 data memory cells, two edge dummy memory cells and one each of the SGD and SGS transistors.

The stack includes a substrate 611. In one approach, a portion of the source line SL comprises an n-type source diffusion layer 611a in the substrate which is in contact with a source end of each string of memory cells in a block. The n-type source diffusion layer 611a is formed in a p-type well region 611b, which in turn is formed in an n-type well region 611c, which in turn is formed in a p-type semiconductor substrate 611d, in one possible implementation. The n-type source diffusion layer may be shared by all of the blocks in a plane, in one approach.

NS1 has a source-end 613 at a bottom 616b of the stack 616 and a drain-end 615 at a top 616a of the stack. Metal-filled slits 617 and 620 may be provided periodically across the stack as interconnects which extend through the stack, such as to connect the source line to a line above the stack. The slits may be used during the formation of the word lines and subsequently filled with metal. A portion of a bit line BL0 is also depicted. A conductive via 621 connects the drain-end 615 to BL0.

In one approach, the block of memory cells comprises a stack of alternating control gate layers (e.g., conductive layers or regions) and dielectric layers or regions, and the memory cells are arranged in vertically extending memory holes in the stack.

In one approach, each block comprises a terraced edge in which vertical interconnects connect to each layer, including the SGS, WL and SGD layers, and extend upward to horizontal paths to voltage sources.

FIG. 6B depicts an example transistor 650. The transistor comprises a control gate CG, a drain D, a source S and a channel CH and may represent a memory cell or a select gate transistor, for example.

FIG. 6C depicts a close-up view of the region 622 of the stack of FIG. 6A, where the stack comprises a single tier. Memory cells are formed at the different levels of the stack at the intersection of a word line layer and a memory hole. The word line layers are connected to control gates of the memory cells. This example includes memory cells 680, 681, 682, 683 and 684 in WLL10, WLL9, WLL8, WLL7 and WLL6. The word line layers are spaced apart by dielectric layers DL14, DL13, DL12 and DL11A which each have a thickness of d1. This is also an inter-cell distance, or the distance between each pair of adjacent memory cells along the z or vertical axis.

A number of layers can be deposited along the sidewall (SW) of the memory hole 630 and/or within each word line layer, e.g., using atomic layer deposition. For example, each pillar 699 or column which is formed by the materials within a memory hole can include a blocking oxide/block high-k material 660, a charge-trapping layer 663 or film such as silicon nitride (Si3N4) or other nitride, a tunneling layer 664 and a channel 665 (e.g., comprising polysilicon). A dielectric core 666 fills a remainder of the memory hole. A word line layer can include a metal barrier 661, and a conductive metal 662 such as Tungsten as a control gate. For example, control gates 690, 691, 692, 693 and 694 are provided. Additional pillars are similarly formed in the different memory holes. A pillar can form a columnar active area (AA) of a string.

Each string comprises a channel which extends continuously from the source-end select gate transistor to the drain-end select gate transistor.

When a memory cell is programmed, electrons are stored in a portion of the charge-trapping layer which is associated with the memory cell. These electrons are drawn into the charge-trapping layer from the channel, and through the tunneling layer. The Vth of a memory cell is increased in proportion to the amount of stored charge. During an erase operation, the electrons return to the channel.

Each of the memory holes can be filled with a plurality of annular layers comprising a blocking oxide layer, a charge trapping layer, a tunneling layer and a channel layer. A core region of each of the memory holes is filled with a body material, and the plurality of annular layers are between the core region and the word line in each of the memory holes.

The NAND string can be considered to have a floating body channel because the length of the channel is not formed on a substrate. Further, the NAND string is provided by a plurality of word line layers above one another in a stack, and separated from one another by dielectric layers.

Figure 6D:
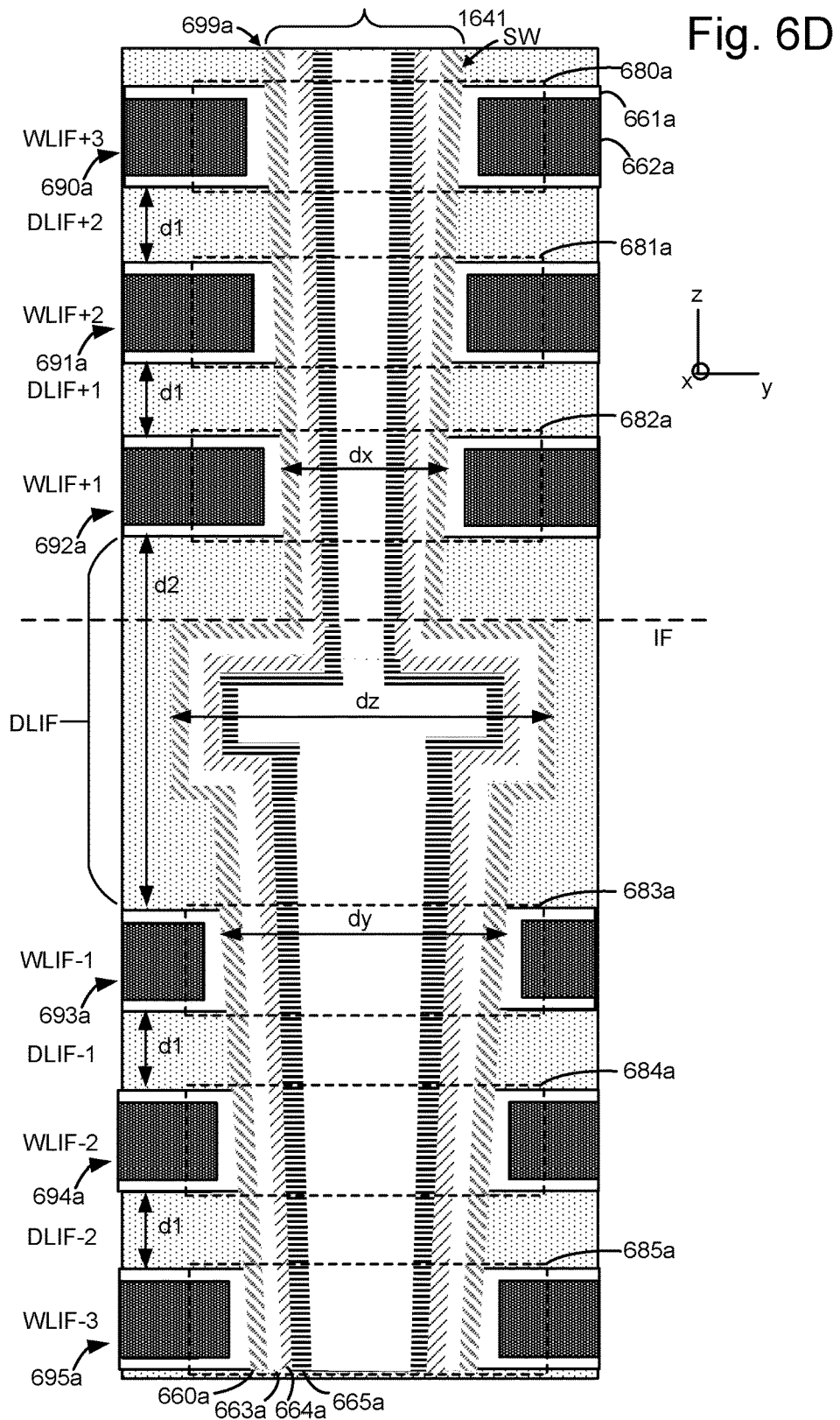
FIG. 6D depicts a close-up view of a region 623 of the stack of FIG. 19G, where an interface IF is formed between two tiers of the stack.
Figure 19G:
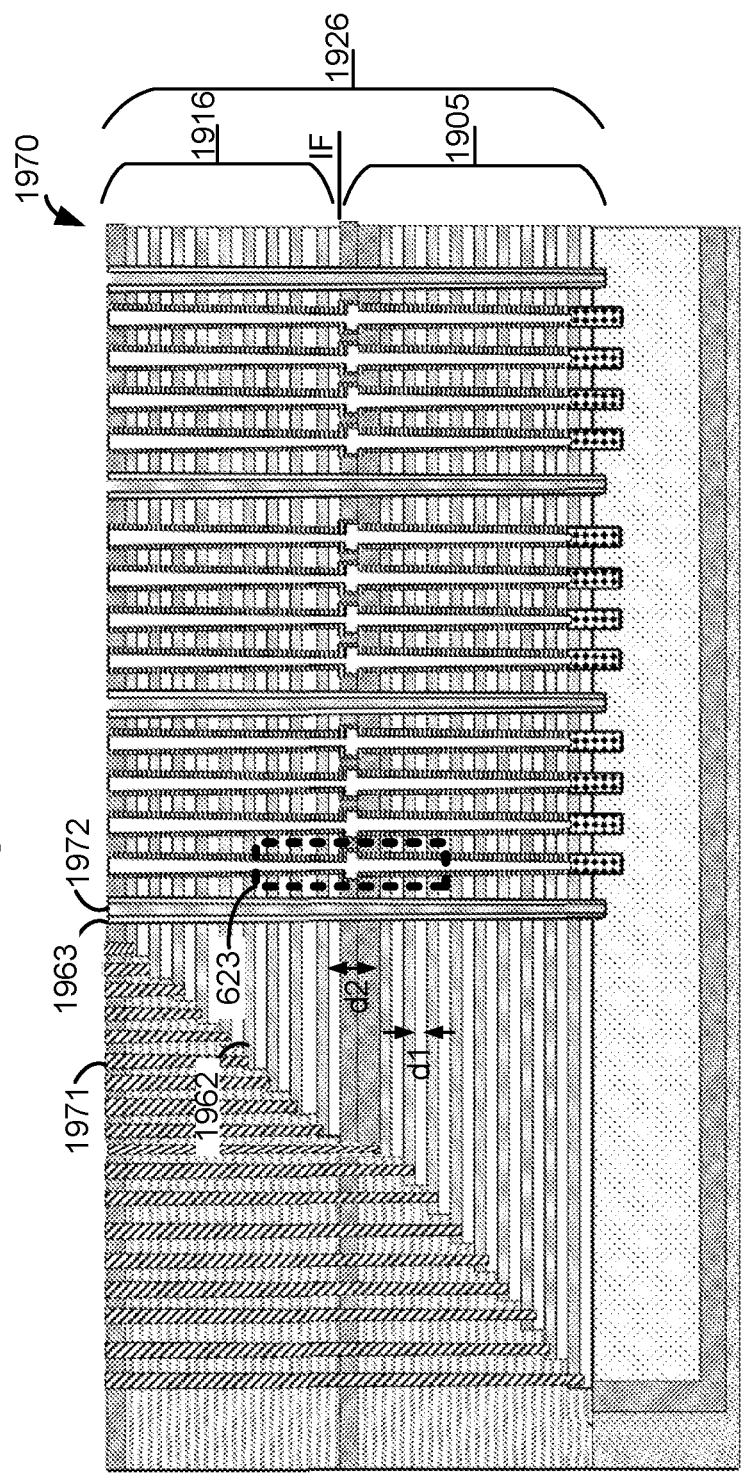
FIG. 19G depicts a semiconductor structure in a configuration which is consistent with steps 1809 and 1810 of FIG. 18.

FIG. 6D depicts a close-up view of a region 623 of the stack of FIG. 19G, where an interface IF is formed between two tiers of the stack. This example includes memory cells 680a, 681a, 682a, 683a, 684a and 685a in word line layers WLIF+3, WLIF+2, WLIF+1, WLIF-1, WLIF-2 and WLIF-3, respectively. The numbering of the word lines in this example is relative to the interface. The word line layers are spaced apart by dielectric layers DLIF+2, DLIF+1, DLIF-1 and DLIF-2, which each have a thickness of d1 (a first distance), and by DLIF, which has a larger thickness d2 (a second distance) or height which is the distance between the memory cells 682a and 683a. D1 and d2 are also inter-cell distances, or the distance between adjacent memory cells along the z or vertical axis. In one approach, d2 is at least twice the height of d1. D2 could be 2-5 times the height of d1, for instance.

DLIF can be an aggregated layer which is made up of dielectric materials which are deposited in one or more separate layers on top of one another. The memory cell 682a is adjacent to and above the interface and the memory cell 683a is adjacent to and below the interface. These are interface memory cells. The second distance spans the interface. In some cases, the memory cells 682a and 683a can be set as dummy memory cells which are ineligible to store user data, due to the difficulty in controlling the channel region along the distance d2. WLIF+1 and WLIF-1 are dummy word lines in this case.

The memory hole which is etched through each tier of the stack has a tapered shape, e.g., wider at the top and narrower at the bottom. As a result, the memory hole diameter dy at the top word line layer or memory cell in the lower tier is larger than the memory hole diameter dx at the bottom word line layer or memory cell in the upper tier. A diameter dz represents a widest region of the memory hole. This widened region is used to accommodate small misalignments in the memory hole portion of the upper tier relative to the memory hole portion in the lower tier. The increase thickness d2 of DLIF is provided due to process margin concerns and also accommodates misalignment by providing a transition region between the memory hole portions in the two tiers.

The column 1941 (FIG. 19D) or memory hole 1931 (FIG. 19C) comprises an interface at which a diameter of the memory hole widens, partway along a height of the memory hole.

As in FIG. 6C, a number of layers can be deposited along the sidewall of the memory hole. The layers can conform to the changing diameter in the interface. For example, each pillar 699a or column which is formed by the materials within a memory hole can include a blocking oxide/block high-k material 660a, a charge-trapping layer 663a or film, a tunneling layer 664a and a channel 665a. A dielectric core 666s fills a remainder of the memory hole. A word line layer can include a metal barrier 661a, and a conductive metal 662a as a control gate. For example, control gates 690a, 691a, 692a, 693a, 694a and 695a are provided.

Figure 7:
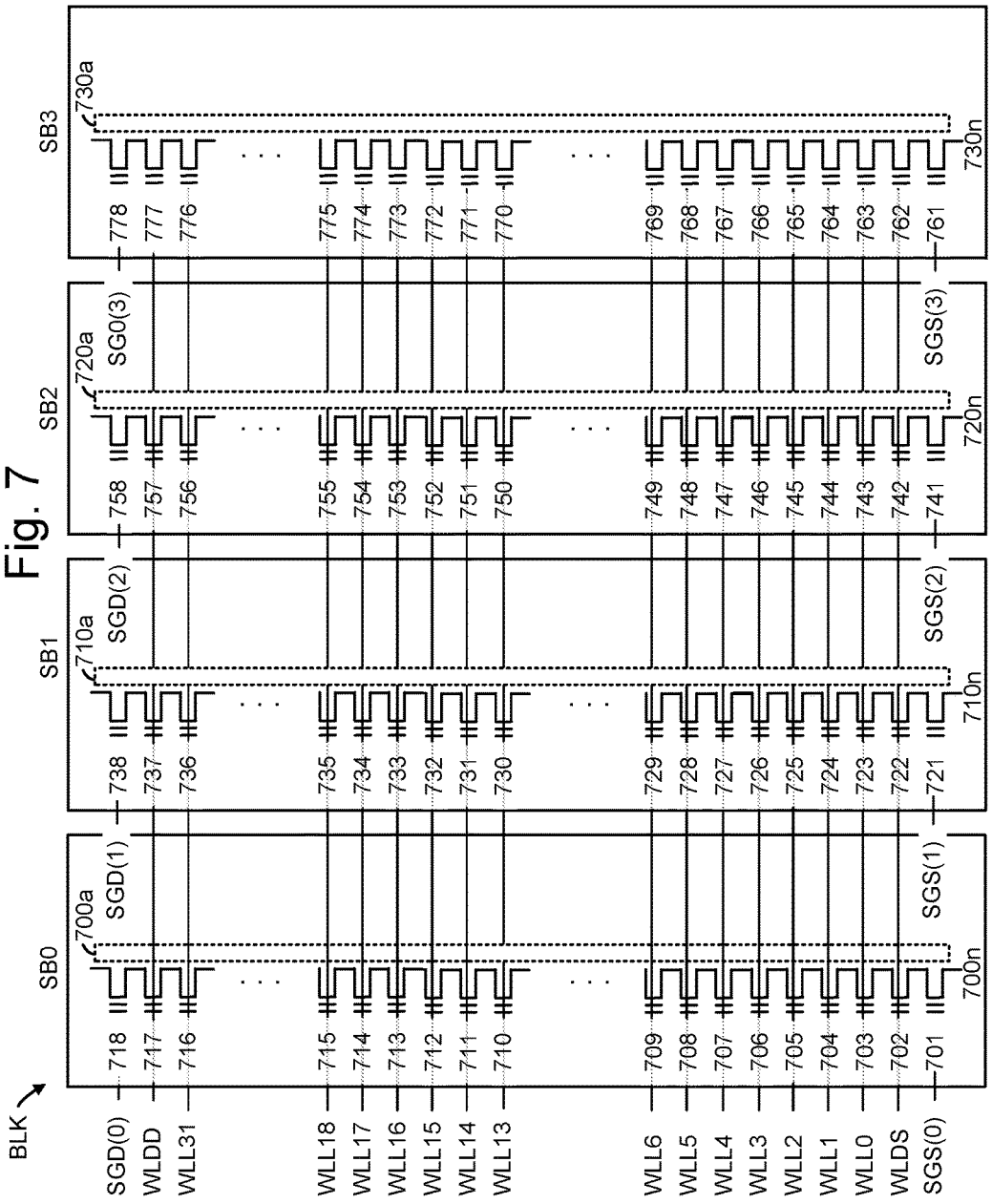
FIG. 7 depicts an example view of NAND strings in sub-blocks in a 3D configuration.

FIG. 7 depicts an example view of NAND strings in sub-blocks in a 3D configuration. Each sub-block includes multiple NAND strings or other sets of memory cells connected to one another, where one example NAND string is depicted for each sub-block. For example, SB0, SB1, SB2 and SB3 comprise example NAND strings 700n, 710n, 720n and 730n, respectively. In this example, each string has one SGD transistor, one drain-side dummy memory cell, thirty-two data memory cells (where sixteen are above the interface IF and sixteen are below the interface), one source-side dummy memory cell and one SGS transistor.

In a block BLK, each sub-block comprises a set of NAND strings which extend in the x direction and which have a common SGD line. The NAND strings 700n, 710n, 720n and 730n are in sub-blocks SB0, SB1, SB2 and SB3, respectively. Programming of the block may occur one sub-block at a time. Within each sub-block, a word line programming order may be followed, e.g., starting at WL0, the source-end word line and proceeding one word line at a time to WLL31, the drain-end word line.

The NAND strings 700n, 710n, 720n and 730n have channels 700a, 710a, 720a and 730a, respectively.

Additionally, NAND string 700n includes SGS transistor 701, dummy memory cells 702 and 717, data memory cells 703-716, and SGD transistor 718.

NAND string 710n includes SGS transistor 721, dummy memory cells 722 and 737, data memory cells 723-736, and SGD transistor 738.

NAND string 720n includes SGS transistor 741, dummy memory cells 742 and 757, data memory cells 743-756, and SGD transistor 758.

NAND string 730n includes SGS transistor 761, dummy memory cells 762 and 777, data memory cells 763-776, and SGD transistor 778.

The SGD transistors in SB0, SB1, SB2 and SB3 may be driven by separate control lines SGD(0) and SGD(1), SGD(2) and SGD(3), respectively. The SGS transistors in SB0, SB1, SB2 and SB3 may be driven by control lines SGS(0), SGS(1), SGS(2) and SGS(3), respectively.

Figure 8:
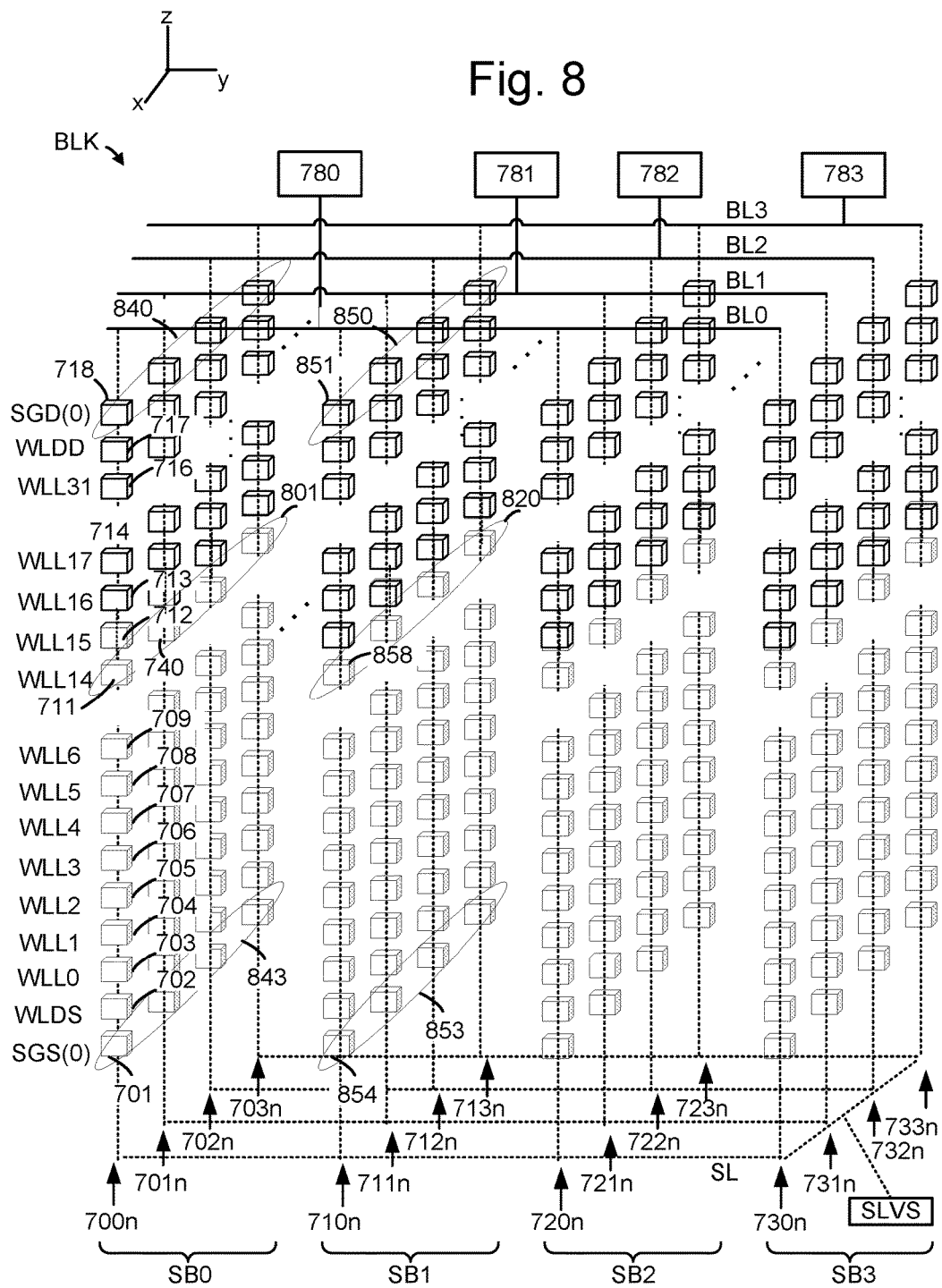
FIG. 8 depicts additional detail of the sub-blocks SB0-SB3 of FIG. 7.

FIG. 8 depicts additional detail of the sub-blocks SB0-SB3 of FIG. 7. Example memory cells are depicted which extend in the x direction along word lines in each sub-block. Each memory cell is depicted as a cube for simplicity. SB0 includes NAND strings 700n, 701n, 702n and 703n. SB1 includes NAND strings 710n, 711n, 712n and 713n. SB2 includes NAND strings 720n, 721n, 722n and 723n. SB3 includes NAND strings 730n, 731n, 732n and 733n. Bit lines are connected to sets of NAND strings. For example, a bit line BL0 is connected to NAND strings 700n, 710n, 720n and 730n, a bit line BL1 is connected to NAND strings 701n, 711n, 721n and 731n, a bit line BL2 is connected to NAND strings 702n, 712n, 722n and 732n, and a bit line BL3 is connected to NAND strings 703n, 713n, 723n and 733n. Sensing circuitry may be connected to each bit line. For example, sensing circuitry 780, 781, 782 and 783 is connected to bit lines BL0, BL1, BL2 and BL3. A bit line voltage source may be provided with the sensing circuitry.

Programming and reading can occur for selected cells in one word line and one sub-block at a time. This allows each selected cell to be controlled by a respective bit line and/or source line. For example, a set of memory cells 801, which includes example memory cells 711 and 740 in NAND strings 700n and 701n, respectively, is connected to WLL14 in SB0. Assume WLL14 is WLn as an example.

WLL31 is the drain-end or drain-edge data word line and WLL0 is the source-end or source-edge data word line. A set of memory cells may be programmed or read concurrently. An additional set of memory cells is connected to WLL14 in each of the other sub-blocks SB1-SB3. For example, a set of memory cells 820, which includes an example memory cell 858 in NAND string 710n, is connected to WLL14 in SB1.

When the selected memory cells of WLL14 in SB0 are programmed (e.g., memory cell 740), the unselected memory cells of WLL14 in SB0 (e.g., memory cell 711), and the unselected memory cells of WLL14 in SB1-SB3 (e.g., memory cell 858 in SB1) are most susceptible to the hot electron injection type of disturb. The memory cells being programmed in a current program loop are the selected memory cells, the associated word line is a selected word line or word line layer and the associated sub-block is a selected sub-block. The word lines other than WLL14 are the unselected word lines or word line layers. The notations WLn, WLn−1 and WLn+1 may be used to represent a selected word line, an adjacent source-side unselected word line, and an adjacent drain-side unselected word line, respectively. WLL15 is an adjacent drain-side word line of WLL14.

In this example, the source line SL or source region is driven at a voltage Vsl by a voltage source, SLVS.

Each string includes one or more SGD transistors at the drain-end and one or more SGS transistors at the source end. In this case, there is one SGD transistor and one SGS transistor per string. Each SGD transistor may be connected to separate control line layer in each sub-block, as in FIG. 7, so that it can be driven separately, or the two or more SGD transistors in a NAND string, when present, may have their control gates connected and commonly driven in a sub-block. For example, SB0 has a set of SGD transistors 840, with an example SGD transistor 718 in the string 700n. SB0 also has a set of SGS transistors 843, with an example SGS transistor 701 in the string 700n. Similarly, SB1 has a set of SGD transistors 850, with an example SGD transistor 851 in the string 710n. SB1 also has a set of SGS transistors 853, with an example SGS transistor 854 in the string 710n.

FIG. 9A depicts an example threshold voltage (Vth) distribution of a set of memory cells connected to a selected word line after a programming operation, where four data states are used. A Vth distribution 900 is provided for erased (Er) state memory cells. Three Vth distributions 910, 912 and 914 represent assigned data states A, B and C, respectively, which are reached by memory cells when their Vth exceeds the verify voltage VvA, VvB or VvC, respectively. This example uses four data states. Other numbers of data states can be used as well, such as eight or sixteen. Read voltages VrA, VrB and VrC are used to read data from a set of cells having this Vth distribution. These verify voltages and read voltages are examples of control gate read levels of the selected word line voltage.

During a programming operation, the final Vth distribution can be achieved by using one or more programming passes. Each pass may use incremental step pulse programming, for instance. During a programming pass, program loops are performed for a selected word line. A program loop comprises a program portion in which a program voltage is applied to the word line followed by a verify portion in which one or more verify tests are performed. Each programmed state has a verify voltage which is used in the verify test for the state.

A single-pass programming operation involves one sequence of multiple program-verify operations (or program loops) which are performed starting from an initial Vpgm level and proceeding to a final Vpgm level until the threshold voltages of a set of selected memory cells reach the verify voltages of the assigned data states. All memory cells may initially be in the erased state at the beginning of the programming pass. After the programming pass is completed, the data can be read from the memory cells using read voltages which are between the Vth distributions. At the same time, a read pass voltage, Vread pass (e.g., 8-10 V), also referred to as Vread, is applied to the remaining word lines. By testing whether the Vth of a given memory cell is above or below one or more of the read reference voltages, the system can determine the data state which is represented by a memory cell. These voltages are demarcation voltages because they demarcate between Vth ranges of different data states.

Moreover, the data which is programmed or read can be arranged in pages. For example, with four data states, or two bits per cell, two pages of data can be stored. An example encoding of bits for the Er, A, B and C states is 11, 10, 00 and 01, respectively, in the format of upper page (UP) bit/lower page (LP) bit. A lower page read may use VrA and VrC and an upper page read may use VrB.

FIG. 9B depicts an example Vth distribution of the set of memory cells of FIG. 9A, showing the effects of hot electron injection (HEI) type of disturb. HEI disturb involves inadvertent programming of unselected memory cells connected to a selected word line due to voltage gradients in the channels of the NAND strings of the unselected memory cells. The disturb results in a Vth upshift for a memory cell and is strongest for erased state memory cells. The disturb is proportional to the magnitude and duration of the voltage gradient.

The plot 900a represent the erased state Vth with a relatively small amount of disturb, and the plot 900b represent the erased state Vth with a relatively large amount of disturb.

When a multi-tier stack is used, the amount of disturb is significantly greater for the upper tier word lines, e.g., for the memory cells above the interface of a multi-tier stack, than for the memory cells below the interface. This is due to the early cutoff of the channel region in the interface and the resulting trapping of electrons in the channel in the lower tier after a verify test. See also FIGS. 17A and 17B.

FIG. 9C depicts an example Vth distribution of a set of memory cells connected to a selected word line after a programming operation, where eight data states are used. Single-pass or multi-pass programming may be used to obtain this Vth distribution. Based on the write data as indicated, the memory cells which are to remain in the Er state are represented by the Vth distribution 920. The memory cells which are to be programmed to the A, B, C, D, E, F and G states using verify voltages of VvA, VvB, VvC, VvD, VvE, VvF and VvG, respectively, are represented by the Vth distributions 921, 922, 923, 924, 925, 926 and 927, respectively. Each data state represents three bits of data as indicated. Read voltages VrA, VrB, VrC, VrD, VrE, VrF and VrG can be used for reading the states of the memory cells in a read operation. These verify voltages and read voltages are examples of control gate read levels of the selected word line voltage. Other example programming operations may use additional data states and/or programming passes. For example, sixteen data state are possible.

With eight data states, or three bits per cell, three pages of data can be stored. An example encoding of bits for the A, B, C, D, E, F and G states is 111, 110, 100, 000, 010, 011, 001 and 101, respectively. The data of the lower page can be determined by reading the memory cells using read voltages of VrA and VrE. The data of the middle page can be determined by reading the memory cells using read voltages of VrB, VrD and VrF. The data of the upper page can be determined by reading the memory cells using read voltages of VrC and VrG.

Figure 10A:
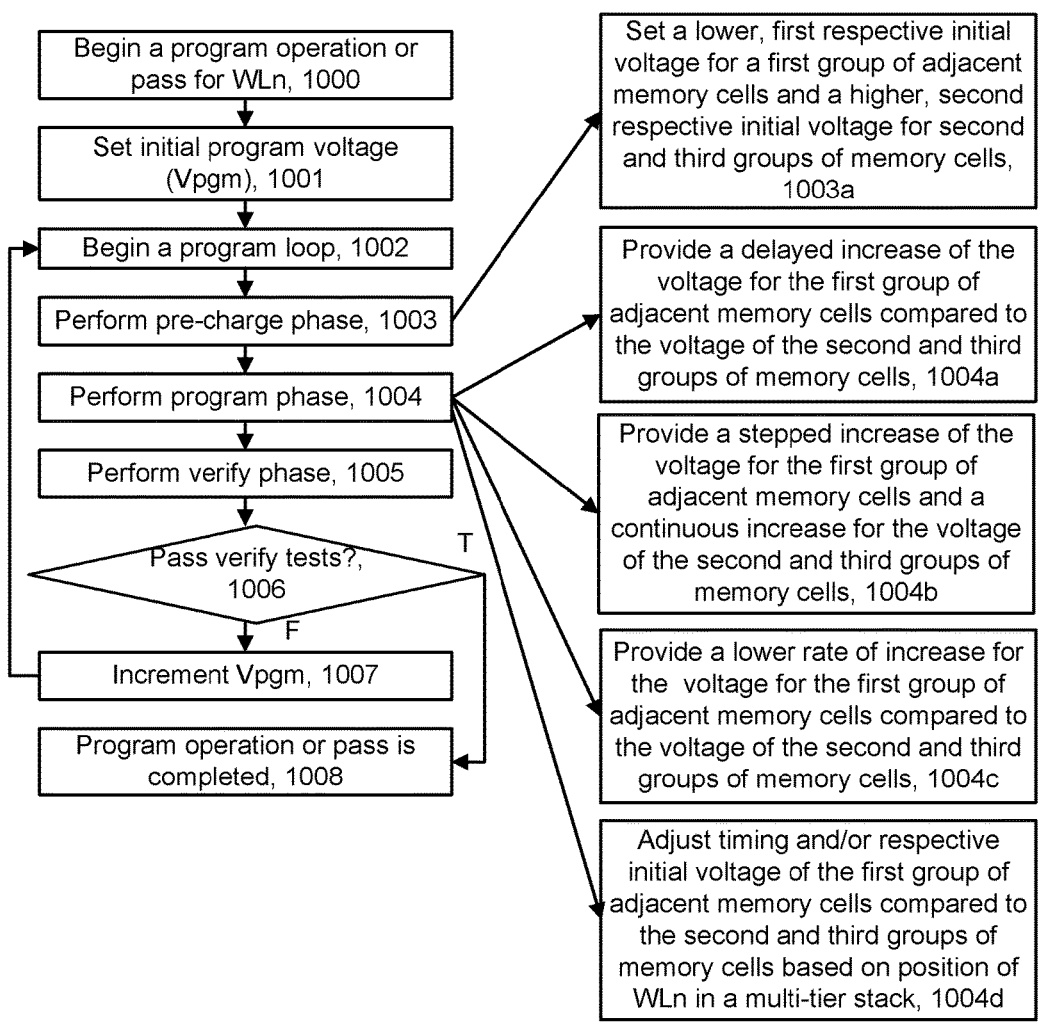
FIG. 10A depicts a process for programming data memory cells in which a disturb countermeasure can be implemented.

FIG. 10A depicts a process for programming data memory cells in which a disturb countermeasure can be implemented. Step 1000 begins a program operation or pass. In one approach, a programming operation comprises one or more program passes. Step 1001 sets an initial program voltage (Vpgm). See, e.g., FIG. 11 and Vpgm_init. Step 1002 begins a program loop. Step 1003 performs a precharge phase. See also FIG. 12A at t0-t2. In this phase, a bit line voltage Vbl such as 2 V is passed to the drain-side of the channels of the selected and unselected strings. Optionally, Vsl is also passed to the source-side of the channels. This provides some boosting of the channels and removes residue electrons to facilitate boosting in the program phase. Step 1004 includes performing a program phase. See also FIG. 12A at t2-t10. In this phase, the voltages of the unselected word lines are increased from the initial voltage used during the pre-charge phase to a pass voltage. This increase provides a capacitive coupling up of the voltages of the unselected strings. The select gate transistors of the unselected strings are in a non-conductive state to allow the coupling up. For example, Vbl can be set high for the unselected strings to provide the SGD transistors in a non-conductive state and low for the selected strings to provide the SGD transistors in a conductive state.

Subsequently, a program voltage or pulse is applied to a selected word line. This step also includes setting a program or inhibit status for the memory cells connected to the selected word line. A memory cell with an inhibit status has the associated bit line of the string set to a high level, e.g., 2-3 V which inhibits programming. A memory cell with a program status has the associated bit line of the string set to a low level, e.g., 0 V, which allows programming.

Step 1005 includes performing a verify phase, e.g., one or more verify tests, for the selected memory cells. See also FIG. 12A at t10-t12. This can involve applying a voltage at one or more control gate read levels (e.g., plot 1201) to the selected memory cells via the selected word line while applying a voltage at a read pass level (e.g., plot 1210, 1240, 1250 or 1260 in FIGS. 12A and 12B) to unselected word lines while sensing the memory cells. The sensing of a memory cell can involve detecting a level of a current in the associated string. The verify test determines whether each selected memory cell is in a conductive or non-conductive state. A decision step 1006 determines whether the verify tests are passed. If decision step 1006 is true, the program operation or pass is completed at step 1008. If the decision step 1006 is false, step 1007 increments Vpgm, and another program loop begins at step 1002. In a given program loop, a verify test may be performed for one or more assigned data states. For each assigned data state, the corresponding verify test is passed if all, or nearly all, of the memory cells which have the assigned data state pass the verify test. For example, the verify test may be passed if all, or nearly all, of the memory cells which have the assigned data state have a Vth greater than the control gate read level. This may be indicated by a current in the string exceeding a specified level as measured by a decay in the bit line voltage.

Steps 1003 and/or 1004 can include one or more disturb countermeasures. The countermeasures can involve using a different timing and/or respective initial voltage for increasing the voltage for the first group of adjacent memory cells to a pass voltage compared to increasing the voltage of the second and third groups of adjacent memory cells to a pass voltage. For example, step 1003 can include step 1003a. This step includes setting a lower, first respective initial voltage (e.g., a negative voltage) for a first group of adjacent memory cells or word lines (e.g., including WLn and one or more word lines on a drain-side of WLn; see example group 1401 in FIG. 14A) and a higher, second respective initial voltage (e.g., 0 V) for a second group (on a drain-side of the first group; see example group 1402 in FIG. 14A) and a third group (on a source-side of WLn; see example group 1400 in FIG. 14A) of memory cells or word lines. In one option, the memory cells in the second group are adjacent to one another and the memory cells in the third group are adjacent to one another. See also FIG. 12B and plot 1260. Optionally, the first group comprises only WLn.

Figure 12B:
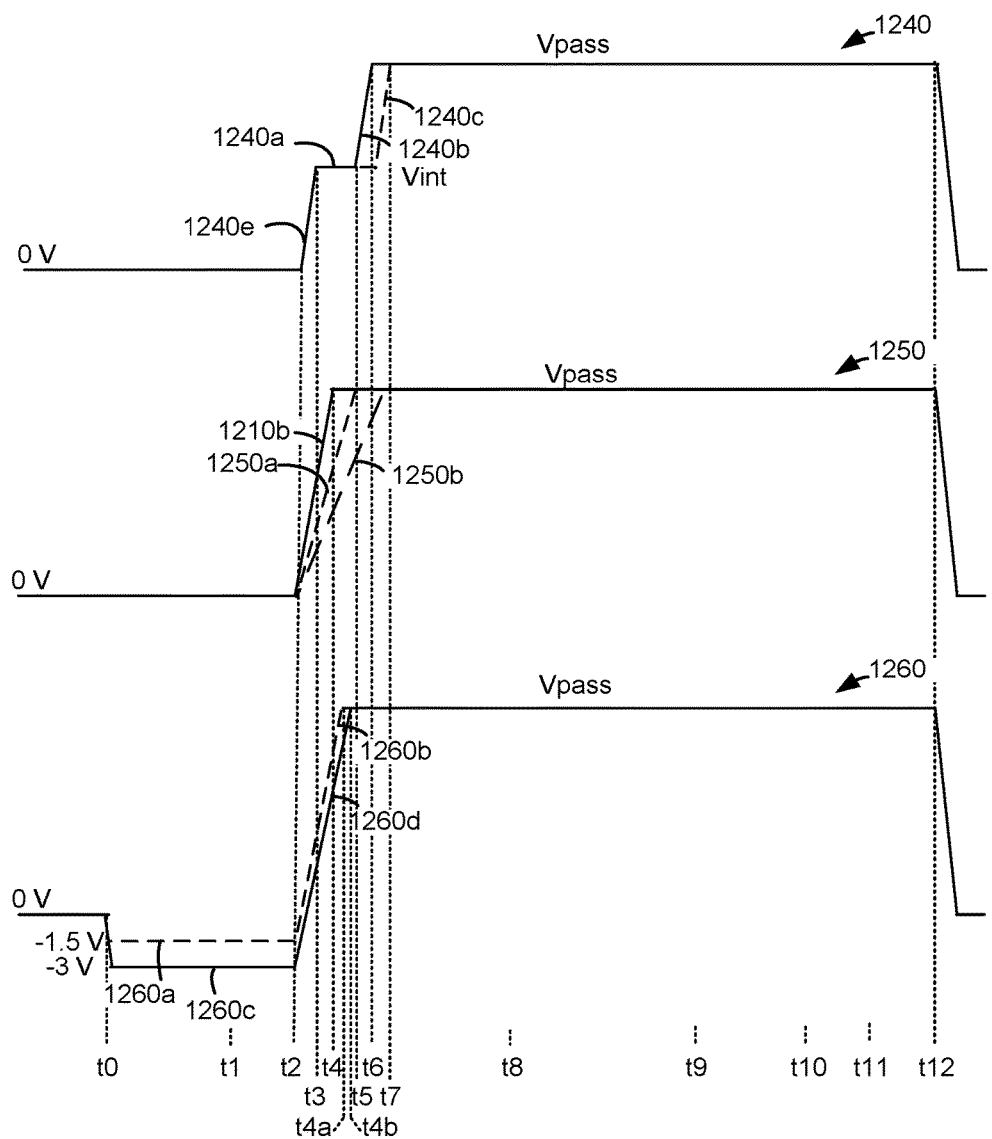
FIG. 12B depicts additional examples of plots of voltages which can be used in a program loop of a program operation, consistent with FIG. 10A.

Step 1004a can include one or more of steps 1004a-1004d. Step 1004a includes providing a delayed increase of the voltage for the first group of adjacent memory cells compared to the voltage of the second and third groups of memory cells. See FIG. 12A, plot 1210. Step 1004b includes providing a stepped increase of the voltage for the first group of adjacent memory cells and a continuous increase for the voltage of the second and third groups of memory cells. See FIG. 12B, plot 1240. Step 1004c includes providing a lower rate of increase for the voltage for the first group of adjacent memory cells compared to the voltage of the second and third groups of memory cells. See FIG. 12B, plot 1250. Step 1004d includes adjusting a timing and/or respective initial voltage of the first group of adjacent memory cells compared to the second and third groups of memory cells based on a positions of WLn in a multi-tier stack. See, e.g., FIGS. 17A and 17B for further details.

In one option, a disturb countermeasure is performed in each program loop of a programming operation. However, other options are possible. For example, a disturb countermeasure can be performed for fewer than all program loops of a programming operation. In one option, the disturb countermeasure is omitted for the first program loop since the channel voltage differential which is caused by the decrease of the word line voltages after the previous program loop is not present. Also, the disturb countermeasure can be performed during programming of fewer than all data word lines of a block.

Figure 10B:
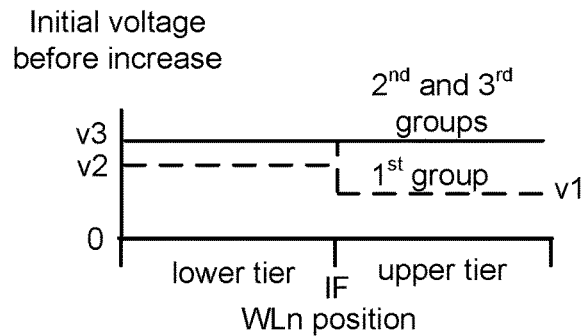
FIG. 10B depicts a plot of an initial voltage before an increase for first, second and third groups of memory cells as a function of the WLn position in a multi-tier stack, consistent with steps 1003c and 1004d of FIG. 10A.

FIG. 10B depicts a plot of an initial voltage before an increase for first, second and third groups of memory cells as a function of the WLn position in a multi-tier stack, consistent with steps 1003c and 1004d of FIG. 10A. As an example, a multi-tier stack comprises a lower tier and an upper tier. As discussed further in connection with FIGS. 17A and 17B, for instance, disturbs are significantly reduced when WLn is in the lower tier but remains a problem when WLn is in the upper tier of a multi-tier stack. Accordingly, in one option, a disturb countermeasure can be used when WLn is in the upper tier but not in the lower tier. In another option, a relatively strong disturb countermeasure can be used when WLn is in the upper tier and a relatively weak disturb countermeasure is used when WLn is in the lower tier. For example, a stronger countermeasure can involve using a lower initial voltage during pre-charge (FIG. 10B), a longer delay for a voltage increase after pre-charge (FIG. 10C), a longer hold time at Vint (FIG. 10D) and/or a lower rate of increase (FIG. 10E).

The horizontal axis indicates whether WLn is in the lower or upper tier, where the tiers are separated by an interface (IF). When WLn is in the lower tier, the initial voltage may be a relatively high voltage of v3 for all groups of word lines (solid line; no disturb countermeasure), or v3 may be used for the second and third groups while the relatively low voltage v2 is used for the first group (dashed line; weak disturb countermeasure). When WLn is in the upper tier, v3 may be used for the second and third groups (solid line) while v1<v2 is used for the first group (dashed line; strong disturb countermeasure).

In accordance with FIG. 10B, the respective initial voltage (v2) of a selected memory cell (or group 1) is lower than the respective initial voltage (v3) of a drain-side memory cell (or group 2) by a first amount (v3-v2) when the selected word line is in the upper tier and is lower than the respective initial voltage (v3) of the drain-side memory cell by a second amount (v3-v1), larger than the first amount, when the selected word line is in the lower tier.

Figure 10C:
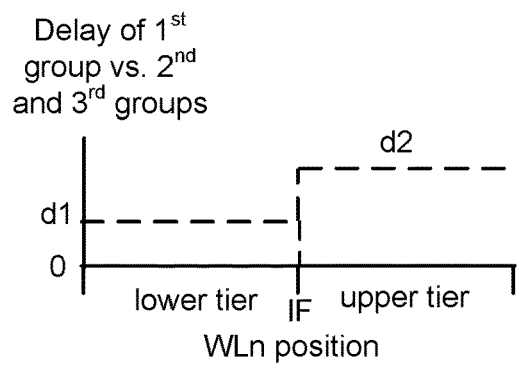
FIG. 10C depicts a plot of a delay in the start of a voltage increase for a first group of memory cells relative to the start of a voltage increase for second and third groups of memory cells, as a function of the WLn position in a multi-tier stack, consistent with steps 1004 and 1004d of FIG. 10A.

FIG. 10C depicts a plot of a delay in the start of a voltage increase for a first group of memory cells relative to the start of a voltage increase for second and third groups of memory cells, as a function of the WLn position in a multi-tier stack, consistent with steps 1004 and 1004d of FIG. 10A. When WLn is in the lower tier, the delay may be zero for all groups of word lines (solid line; no disturb countermeasure), or a relatively small delay d1 may be used for the first group (dashed line; weak disturb countermeasure). When WLn is in the upper tier, the delay may be a relatively large delay d2>d1 zero for the first group (dashed line; strong disturb countermeasure).

Figure 10D:
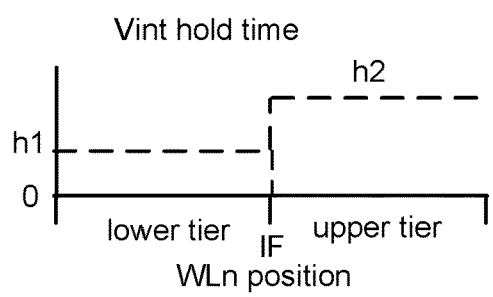
FIG. 10D depicts a plot of a hold time for an intermediate voltage (Vint) during a voltage increase for a first group of memory cells as a function of the WLn position in a multi-tier stack, consistent with steps 1004b and 1004d of FIG. 10A.
Figure 10E:
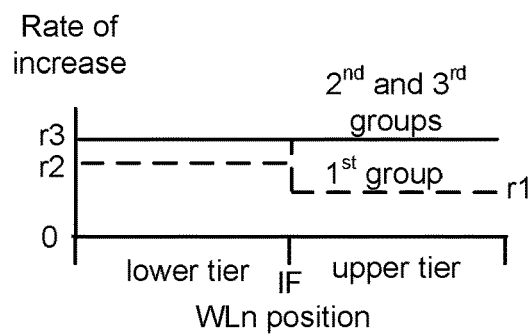
FIG. 10E depicts a plot of a rate of voltage increase for first, second and third groups of memory cells as a function of the WLn position in a multi-tier stack, consistent with steps 1004c and 1004d of FIG. 10A.

FIG. 10D depicts a plot of a hold time for an intermediate voltage (Vint) during a voltage increase for a first group of memory cells as a function of the WLn position in a multi-tier stack, consistent with steps 1004b and 1004d of FIG. 10A. When WLn is in the lower tier, the hold time may be zero for all groups of word lines (solid line; no delay or disturb countermeasure), or a relatively small hold time h1 may be used for the first group (dashed line; weak disturb countermeasure). When WLn is in the upper tier, the hold time may be a relatively large hold time h2>h1 for the first group (dashed line; strong disturb countermeasure).

In accordance with FIGS. 10D and 10E, a control circuit may be configured to provide a longer time period for the increase of voltage of the selected word line when the selected word line is in the upper tier than when the selected word line is in the lower tier. This longer time period can involve a stepped increase or a ramped increase, for instance.

FIG. 10E depicts a plot of a rate of voltage increase for first, second and third groups of memory cells as a function of the WLn position in a multi-tier stack, consistent with steps 1004c and 1004d of FIG. 10A. When WLn is in the lower tier, the rate of increase may be a high value of r3 for all groups of word lines (solid line; no disturb countermeasure), or r3 may be used for the second and third groups while the lower rate of increase r2 is used for the first group (dashed line; weak disturb countermeasure). When WLn is in the upper tier, r3 may be used for the second and third groups (solid line) while r1<r2 is used for the first group (dashed line; strong disturb countermeasure).

In accordance with FIG. 10E, a control circuit may be configured to provide a lower rate of the increase of voltage of the selected word line (or the first group) when the selected word line (or the first group) is in the upper tier than when the selected word line (or the first group) is in the lower tier.

In accordance with FIG. 10E, a rate of the increase of the voltage of the selected memory cell (r2) (or first group) is lower than a rate of an increase of the voltage of the drain-side memory cell (r3) (or second group) by a first amount (r3−r2) when the selected word line is in the upper tier and is lower than the rate of the increase of the voltage of the drain-side memory cell (r3) (or second group) by a second amount (r3−r1), larger than the first amount, when the selected word line is in the lower tier.

In accordance with FIG. 10B to 10E, a control circuit may be configured to adjust the at least one of the timing or the respective initial voltage of the selected word line (or the first group) to provide a relatively weak disturb countermeasure when the selected word line (or the first group) is in a lower tier of a multi-tier stack and to provide a relatively strong disturb countermeasure when the selected word line (or the first group) is in an upper tier of the multi-tier stack.

FIG. 11 depicts a series of program loops in an example programming operation, consistent with FIG. 10A. The pulse train 1100 includes a series of program pulses 1101-1115 that are applied to a word line selected for programming. The pulse train 1100 is an example of a second set of step-wise increasing program voltages. A pulse train typically includes program pulses which increase stepwise in amplitude in one or more program loops or program loops of a programming pass using a fixed or varying step size. In some cases, the program pulses increase in each program loop after the first. A new pulse train can be applied in each programming pass, starting at an initial level and ending at a final level which does not exceed a maximum allowed level. The initial levels can be the same or different in different programming passes. The final levels can also be the same or different in different programming passes. The step size can be the same or different in the different programming passes. In some cases, a smaller step size is used in a final programming pass to reduce Vth distribution widths.

Vpgm_init is the initial program voltage. One, two or three verify pulses are provided after each program pulse as an example, based on the assigned data states which are being verified. For example, an A-state verify pulse 1120 (VvA) is applied in program loops 1-3, A-state and B-state verify pulses 1121 (VvA and VvB, respectively) are applied in program loops 4-6, A-state, B-state and C-state verify pulses 1122 (VvA, VvB and VvC, respectively) are applied in program loops 7 and 8, B-state and C-state verify pulses 1123 are applied in program loops 9-11, and a C-state verify pulse 1124 is applied in program loops 12-15.

FIG. 12A depicts examples of plots of voltages which can be used in a program loop of a program operation, consistent with FIG. 10A. FIG. 12B depicts additional examples of plots of voltages which can be used in a program loop of a program operation, consistent with FIG. 10A. In FIGS. 12A and 12B, the vertical dimension denotes voltage and the horizontal dimension denotes time, with time points t0-t12.

The period of time depicted corresponds to one program loop and includes a pre-charge phase 1290 (t042), a program phase 1291 (t2410) and a verify phase 1292 (t10-t12). The period starting at t12 may be considered to be a voltage decrease phase of a program loop. A plot 1200 represents Vwl_sel, the voltage of the selected word line, a plot 1210 represents Vwl_unsel, a voltage of unselected word lines, and optionally region 1200b of Vwl_sel, a plot 1220 represents the select gate voltages, e.g., Vsgd and/or Vsgs, and a plot 1230 represents Vbl.

The region 1200a of plot 1200, which is the voltage during the pre-charge phase, can be modified to the plot 1260 as part of the first group of adjacent memory cells. The region 1200b of plot 1200, which is the voltage during the pre-charge phase, can be modified to follow any of the plots 1210, 1240 or 1250 as part of the first group of adjacent memory cells.

In the pre-charge phase, a positive Vbl (plot 1230a) is provided to the drain-side of the channels of the strings to remove residue electrons and to provide a small amount of boosting such as 1-2 V. The SGD transistors of the selected sub-block (SGD_sel) and unselected sub-block (SGD_unsel) are in a conductive state at this time, with a voltage of 6 V, for example (plot 1220a). This allows the bit line voltage to be passed to the drain end channel. It is also possible for the SGS transistors of the selected sub-block (SGS_sel) and unselected sub-block (SGS_unsel) to be in a conductive state at this time, with a voltage of 6 V, for example (plot 1220a) to allow the source line voltage (Vsl) to be passed to the source end of the channel In the program phase, Vwl_sel and Vwl_unsel are ramped up, e.g., starting at t2-t5, to provide a capacitive coupling up of the channels of the unselected strings. Vwl_sel is then ramped up further at t8 to the peak level of Vpgm. After the program voltage or pulse from t8-t9, Vwl is ramped down to Vss. Subsequently, in the verify phase, one or more verify tests are performed by applying one or more control gate read voltages (plot 1201) on WLn and, for each read voltage, sensing the conductive state of the memory cells in the selected strings of the selected sub-block.

During the program and verify phases, Vsg_sel can be set to, e.g., 2.5 V and 6 V, respectively, for the selected sub-block (plot 1220b). During the program pulse, with Vbl=0 V, this voltage is high enough to provide the SG_sel transistors in a conductive state for the selected strings in the selected sub-block. However, it is low enough that the SG_sel transistors can be provided in a non-conductive state for the locked out strings in the selected sub-block, by setting a high Vbl for those strings. During the verify phase, the SGD transistor is in a strongly conductive state to allow sensing to occur for the selected memory cell. Thus, the drain-end select gate transistor is in a conductive state during the pre-charge phase and the program phase, for the selected strings. Vsg_unsel is decreased to a reduced level such as 0 V (plot 1220c) which provides the SG_unsel transistors in a non-conductive state for the strings in the unselected sub-blocks. After the verify phase, at t12, Vbl is decreased to 0 V so that the SGD transistors are cutoff and the channel region has a floating voltage. When Vsg_sel subsequently decreases from 6 V to 0 V, the channel region is coupled down to −2 V, as discussed in connection with FIG. 13A and channel region 1304 due to the Vth=2 V for the SGD transistors.

During the program and verify phases, Vbl can remain high at 2 V for the unselected strings (plot 1230b) or set low to 0 V (plot 1230c) for the selected strings.

After the verify phase, at t12, Vwl_unsel decreases.

The increase of the word line voltages at plot 1210 follows the option discussed in connection with FIG. 10A, step 1004a. Plot 1210a depicts the word line voltages at Vss=0 V during the pre-charge phase. Subsequently, plot 1210b depicts the word line voltages increasing continuously from Vss to Vpass from t2-t4. This increase may involve a control instructing a voltage driver to make a step change in the voltage to Vpass at t2. The actual change in the voltage will not be immediate due to an RC time constant. The start of the increase is at t2 and the completion is at t4. This example may be used for second and third groups of unselected word lines (groups 1402 and 1400, respectively in FIG. 14A). Plots 1210c and 1210d depict delayed increases in the word line voltages. This example may be used for a first group of unselected word lines (group 1401 in FIG. 14A).

In one option, different delays are used for different subgroups of word lines and memory cells. For example, the larger delay of plot 1210d is used for a first subgroup of word lines comprising WLn and optionally one or more unselected word lines on the drain-side of WLn, and the smaller delay of plot 1210c is used for a second subgroup of one or more unselected word lines which may be adjacent to one another. The unselected word lines may also be adjacent to one another in the first subgroup. The second subgroup may be adjacent to the first subgroup on the drain-side of the first subgroup. The concept can be extended to more than two subgroups as well.

Plots 1210c and 1210d depict the word line voltages increasing continuously from Vss to Vpass from t4-t6 and t5-t7, respectively. The start of the increase is at t4 or t5 and the completion is at t6 or t7 for the smaller and larger delays, respectively.

In another option, only one delayed increase is used for the first group of unselected word lines for a simpler implementation.

For example, in FIG. 14A, WL14 is WLn, a first group 1401 of unselected word lines includes WL14-WL16, a second group 1402 of unselected word lines includes WL17-WL31, and a third group 1400 of unselected word lines includes WL0-WL13. The first subgroup may include WL14 and WL15 and the second subgroup may include WL16, or the first subgroup may include WL14 and the second subgroup may include WL15 and WL16. In one example, plot 1210d may be used for WL14 and WL15 while plot 1210c is used for WL16 and plot 1210b is used for the remaining word lines. A goal of this approach is to provide a more gradual transition in channel voltages between the first and second groups. Further details of the approach of a delayed increase are provided in FIGS. 14A and 14B.

In FIG. 12B, the increase of the word line voltages at plot 1240 follows the option discussed in connection with FIG. 10A, step 1004b. Plot 1240e depicts the word line voltages being increased from 0 V to an intermediate voltage (Vint) (which is between Vss and Vpass) from t2-t3, then being held at Vint for a relatively short period of time of t3-t5 (plot 1240a), and then being increased from Vint to Vpass from t5-t6 (plot 1240b). The increase from Vss to Vint may involve a control instructing a voltage driver to make a step change in the voltage to Vint at t2. The hold at Vint may involve a control instructing a voltage driver to hold the voltage at Vint from t2-t5. The increase from Vint to Vpass may involve a control instructing a voltage driver to make a step change in the voltage to Vpass at t5.

In another option, the hold at Vint is for a relatively long period, from t3-t6 instead of t3-t5. Plot 1240c shows the word line voltages being increased from t6-t7.

In one option, the relatively long hold time at Vint is used for the first subgroup and the relatively short hold time at Vint is used for the second subgroup. The continuous increase of plot 1210b (FIG. 12A) may be used for the remaining word lines, in one approach. The start of the increase is at t2 and the completion is at t6 or t7 for the relatively short and relatively long hold times, respectively.

In one example, plot 1240c may be used for the first subgroup while plot 1240b is used for the second subgroup and plot 1210b is used for the remaining word lines. A goal of this approach is to provide a more gradual transition in channel voltages by gradually transitioning from a larger hold time at Vint to a smaller hold time at Vint. Further details of the approach of a stepped increase are provided in FIGS. 15A and 15B.

In another option, only one stepped increase is used for the first group of unselected word lines for a simpler implementation.

The increase of the word line voltages at plot 1250 follows the option discussed in connection with FIG. 10A, step 1004c. Plot 1210b (repeated from FIG. 12A) depicts the word line voltages being increased from 0 V to Vpass from t2-t4 with no slow down. This increase may involve a control instructing a voltage driver to make a step change in the voltage to Vpass at t2. Plot 1250a depicts the word line voltages being increased from 0 V to Vpass from t2-t5 in a first slow rate. This increase may involve a control instructing a voltage driver to make a ramp change (which is slower than a step change) in the voltage to Vpass starting at t2. Plot 1250b depicts the word line voltages being increased from 0 V to Vpass from t2-t7 in a second slow rate, which is lower than the first slow rate. This increase may involve a control instructing a voltage driver to make a ramp change in the voltage.

This example may be used for a first group of unselected word lines. In one option, the second slow rate of plot 1250b is used for an unselected word line adjacent to WLn on the drain-side of WLn, and the first slow rate of plot 1250a is used for an unselected word line which is non-adjacent to WLn on the drain-side of WLn. Plot 1210b may be used for the remaining word lines, in one approach. The start of the increase is at t2 and the completion is at t5 or t7 for the first and second slow rates, respectively.

In one example, plot 1250b may be used for the first subgroup while plot 1250a is used for the second subgroup and plot 1210b is used for the remaining word lines. A goal of this approach is to provide a more gradual transition in channel voltages by gradually transitioning from the second slow rate of increase of the word line voltages to the first slow rate of increase. Further details of the approach of a ramped increase are similar to those discussed in connection with FIGS. 15A and 15B.

In another option, only one reduced rate increase is used for the first group of unselected word lines for a simpler implementation.

The increase of the word line voltages at plot 1260 follows the option discussed in connection with FIG. 10A, step 1003a. Plot 1260 shows the word line voltages being set to a voltage which is lower than Vss and can be a negative voltage such as −1.5 V (plot 1260a) or −3 V (plot 1260c). Subsequently, plot 1260b show the word line voltages being increased from a respective initial voltage of −1.5 V to Vpass from t2-t4a, and plot 1260d show the word line voltages being increased from a respective initial voltage of −3 V to Vpass from t2-t4b, where t4a is after t4 and t4b is after t4a. Thus, t4, t4a and t4b represent the time of the completion of the voltage increases of plots 1210b, 1260b and 1260*d*, respectively. Plot 1210*b* show the word line voltages being increased from a respective initial voltage of Vss which is greater than the respective initial voltages of plots 1260*a* and 1260*c*. The different respective initial voltages result in different voltage swings for the increases. For example, the voltage swing for plot 1210*b* is Vpass-0 V, the voltage swing for plot 1260*b* is larger at Vpass-(−1.5) V and the voltage swing for plot 1260*d* is even larger at Vpass-(−3) V. For a voltage increase, the voltage swing is the magnitude of the increase in the voltage from its respective initial voltage to its final voltage.

Plots 1260*a* and/or plot 1260*c* may be used for a first group of unselected word lines. In one option, the initial voltage of plot 1260*c* is used for an unselected word line adjacent to WLn on the drain-side of WLn, and the initial voltage of plot 1260*a* is used for an unselected word line which is non-adjacent to WLn on the drain-side of WLn. Plot 1210*b* may be used for the remaining word lines, in one approach.

In one example, plots 1260*c* and 1260*d* are used for the first subgroup while plot 1260*a* and 1260*b* are used for the second subgroup and plot 1210*b* is used for the remaining word lines. A goal of this approach is to provide a more gradual transition in channel voltages by gradually transitioning from a lower initial voltage for one or more drain-side word lines closer to WLn to a higher initial voltage for one or more drain-side word lines further from WLn, to an even higher initial voltage for other word lines even further from WLn, on the drain-side of the one or more drain-side word lines with the higher initial voltage. Further details of using a reduced initial voltage are provided in FIGS. 16A and 16B.

In another option, only one reduced initial voltage is used for the first group of unselected word lines for a simpler implementation.

Figure 13A:
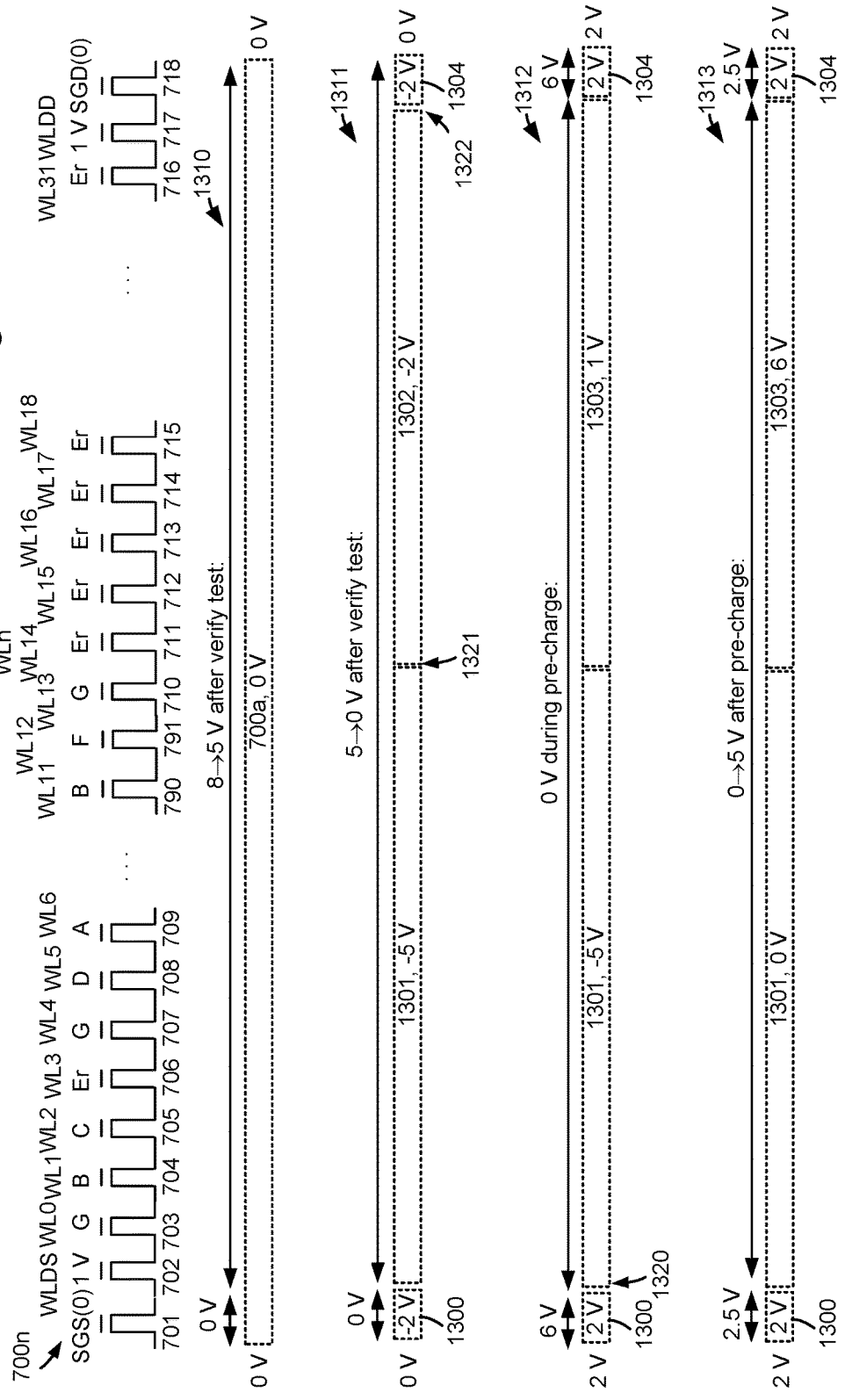
FIG. 13A depicts voltages in a channel of the string 700n of FIG. 7, after a verify test and during a pre-charge operation, in a first example in which all word line voltages are increased at the same time after the pre-charge operation.

FIG. 13A depicts voltages in a channel of the string 700*n* of FIG. 7, after a verify test and during a pre-charge operation, in a first example in which all word line voltages are increased at the same time after the pre-charge operation. In FIG. 13A to 17B, the horizontal direction is a direction along the length of the channel of an unselected string. The length of the channel may extend in the vertical direction in a 3D memory structure. The figures include channel voltage profiles which show voltages of different regions of the channels at different times in a program loop. A voltage at the left side of the profile indicates Vsl=0 V or 2 V and a voltage at the right side of the profile indicates Vbl=0 V or 2 V, consistent with plot 1230*b* of FIG. 12A. The string 700*n* is assumed to be an unselected string in which an unselected memory cell 771 is connected to a selected word line WLL14 (WL14), consistent with FIGS. 7 and 8.

The channel 700*a*, SGS transistor, SGD transistor, word line layers and memory cells of FIG. 7 are depicted. Additionally, data states are depicted for some of the memory cells. In this example, the string or block has been partly programmed, from WL0 through WL13, and WL14 is the selected word line (WLn) where programming has recently started. For example, the program loop may be PL2 in FIG. 14. The programming of the memory cells is random, and the memory cells 703-709, 790, 791 and 710 of the programmed word lines are, e.g., in the G, B, C, Er, G, D, A, B, F and G states, respectively, as an example. Eight data states are used, as in FIG. 9C. The memory cells connected to WLn and to the word lines above WLn, e.g., on the drain-side of WLn, will be in the erased state at this point. The drain-side word lines of WLn are WL15-WL31 and include memory cells 712-7117.

After a verify test in a program loop, e.g., PL1, when the voltages of the unselected word lines Vwl_unsel, decrease from a pass voltage, e.g., a read pass voltage, to Vss, the channel will be cutoff between WLn and SGS(0). A channel voltage profile 1310 shows the channel before the cutoff occurs, when the voltages decrease from 8 to 5 V, for example. Vsl and Vbl=0 V at this time. The channel voltage is 0 V at this time. A channel voltage profile 1311 shows the case where the voltages decrease below 5 V to 0 V. With this decrease, the channel will be cutoff for the memory cells with the highest Vth, e.g., the G state cells. This assumes Vth=5 V for the G state cells. Further, consider the G state cell 710 which is closest to WLn on the source-side of WLn, and the G state cell 703 which is closest to SGS(0). Not all strings will have this arrangement of data states but this is one example and provides a convenient illustration. As the voltages decrease below 5 V, these cells become non-conductive, forming non-conductive junctions 1320 and 1321 in the channel (voltage profile 1312). Three channel regions 1300, 1301 and 1302 are thus formed in which the voltage can float in each region. Since the voltage of the channel region 1301 starts to float when the word line voltage is 5 V, it will be capacitively coupled down to −5 V as the word line voltage decreases to 0 V. A 1:1 coupling ratio is assumed for simplicity.

At the source end of the string, when Vsgs, the voltage on SGS(0), reaches 0 V, the voltage in the channel region 1300 is down coupled to −2 V, assuming Vth=2 V for the SGS transistors. Similarly, at the drain end of the string, when Vsgd, the voltage on SGD(0), reaches 0 V, the voltage in the channel region 1304 is down coupled to −2 V, assuming Vth=2 V for the SGD transistors. In another option, as discussed, Vsgs can remain at 0 V throughout the program loop.

The decrease of the word lines is depicted by plot 1210 in FIG. 12A starting at t12, for instance.

After the word lines voltages are decreased, a pre-charge phase occurs as mentioned. The word line voltages may be at 0 V during the pre-charge phase, while Vsgd/Vsgs are increased to 6 V and Vbl/Vsl are increased 2 V (channel voltage profile 1312). As mentioned, in one approach, Vsgs remains at 0 V during the program loop so that the SGS transistor remains in a non-conductive state, in which case Vsg in plot 1220 represents Vsgd but not Vsgs. In another approach, Vsgs is similar to Vsgd, in which case Vsg in plot 1220 represents Vsgd and Vsgs. When Vbl is increased to 2 V, a junction 1322 or non-conductive region is formed between the SGD transistor 718 and the dummy memory cell 717. A channel region 1304 adjacent to the SGD transistor is at 2 V since Vbl=2 V is passed to this region. A channel region 1303 is at 1 V which is based on the word line voltage of 0 V minus Vth=−1 V for the erased state data memory cells 711-716 and the dummy memory cell 717. The channel region 1301 remains at −5 V since it is isolated from Vbl. Similarly, assuming Vsl is increased to 2 V, a junction 1320 is formed between the SGS transistor 701 and the dummy memory cell 702. A channel region 1300 adjacent to the SGS transistor is at 2 V since Vsl=2 V is passed to this region.

After pre-charge, the word line voltages are increased to Vpass. When the word line voltages increase from 0 to 5 V, the floating channel regions are coupled up by 5 V, so that the channel region 1301 increases to 0 V and the channel region 1303 increases to 6 V (channel voltage profile 1313).

Figure 13B:
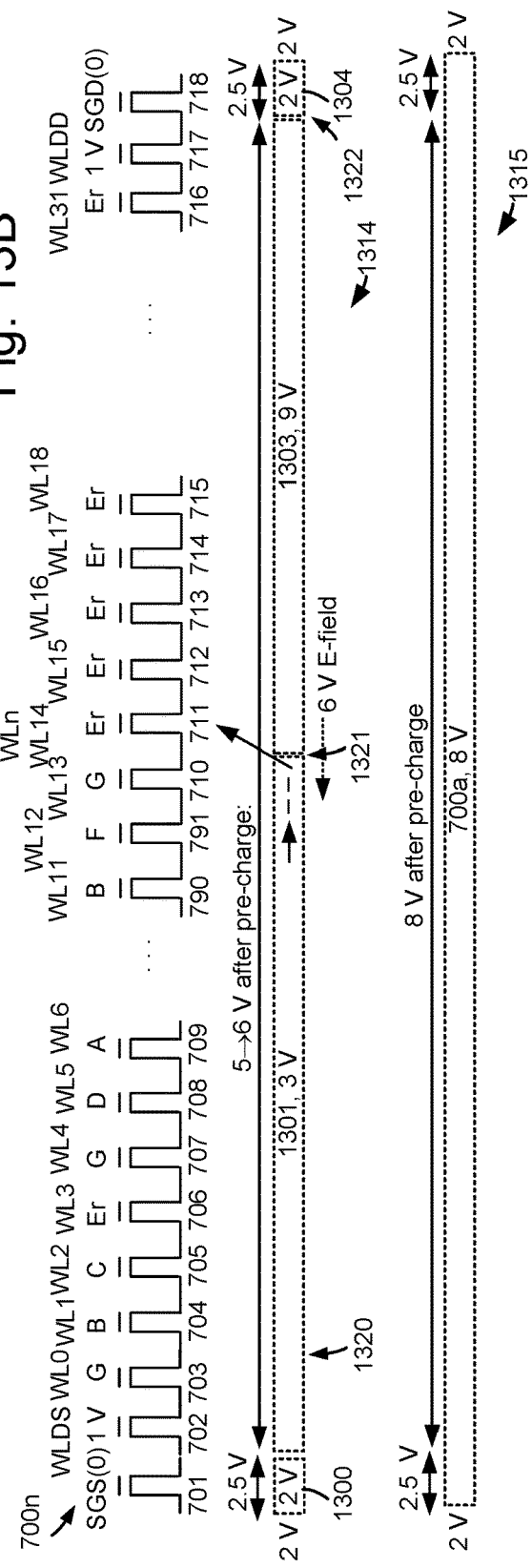
FIG. 13B depicts voltages in a channel in a continuation of FIG. 13A after the pre-charge operation.

FIG. 13B depicts voltages in a channel in a continuation of FIG. 13A after the pre-charge operation. When the word line voltages increase further from 5 V to 8 V, the G state cells start to become weakly conductive and the floating channel regions are coupled up by 3 V, so that the channel regions 1301 and 1303 increase to 3 V and 9 V, respectively (channel voltage profile 1314). The channel voltage adjacent to WLn−1 and WLn may transition to about 6 V, which is midway between the voltages of the regions 1301 and 1303. The voltage difference between the regions 1301 and 1303 creates an electric field (E-field) of 6 V. Electron-hole pairs are generated at the junction 1321 and the electrons (denoted by dashes) adjacent to WLn−1 (WL13) in the region 1301 can be accelerated into the region 1303 by the E-field. With a word line voltage of 8 V, these electrons can be drawn into the charge trapping regions of the memory cells of WLn, causing disturbs.

When the G state cell 710 is weakly turned on, some of the electrons in the source-side channel region 1301 can travel to the drain-side channel region 1303. This occurs because the channel voltage cannot exactly follow the word line voltage increase due to some amount of electrons generated inside the channel.

The channel voltage profile 1315 shows that the channel voltages equalize at a uniform level such as about 8 V when the word line voltages stabilize at the pass voltage.

FIG. 14A depicts voltages in a channel of the string 700n of FIG. 7, after a pre-charge operation, in a second example in which voltages of a first group of adjacent word lines comprising WLn and one or more drain-side word lines of WLn are increased after voltages of remaining word lines are increased, consistent with step 1004a of FIG. 11. The word lines include a first group 1401 which is adjacent to WLn on the drain-side of WLn. The word lines in the group may be adjacent to one another as well. The source or drain-side of a memory cell is a side which faces toward the source end or drain end, respectively, of the string. The word lines of the first group, e.g., WL15 and WL16, can include one or more memory cells, including a memory cell 712 which is adjacent to the selected memory cell 711 and a memory cell 713 which is non-adjacent to the selected memory cell, but adjacent to the memory cell 712. The first group could include about 1-3, 1-5 or 1-10 memory cells or up to about 5-10% of the number of memory cells in a NAND string. A goal is for the first group to encompass a region of the channel which can influence the channel gradient at the junction 1321. However, minimizing the number of cells or word lines in the first group helps reduce the implementation complexity. For example, the driver 447a can be made smaller if it only has to drive a relatively small number of word lines. As a comparison, if the first group included WLn and all drain side word lines rather than a limited number of drain side word lines, the driver 447a would have to be larger. There is also a complexity in the need for additional switches/transistors and control lines to connect the different drivers to the different word lines, where this complexity is greater when the number of word lines in the first group is greater.

Disturbs of the memory cells connected to WLn can be reduced by adjusting a timing and/or respective initial voltage of the increase of the word line voltages in the first group relative to the increase of the word line voltages in the second and third groups.

The word lines also include a second group 1402, which can include the remaining word lines WL17-WL31 and WLDD on the drain-side of the first group, in one approach. The word lines also include a third group 1400, which can include the remaining word lines WLDS and WL0-WL13 on the source-side of WLn, in one approach.

In this example, after the pre-charge, the increase of the word line voltages of the first group (e.g., plot 1210d in FIG. 12A, where the increase starts at t5) is delayed relative to the increase of the word line voltages of the second and third groups (plot 1210b, where the increase starts at t2). The channel voltage profile corresponds to t4 in FIG. 12A. The channel regions 1300, 1301a and 1304 are provided at 2 V, 3 V and 2 V, respectively, as discussed previously. The channel region 1303a is provided at 9 V, similar to the channel region 1303 as discussed previously. The junction 1321 is also created, as discussed previously, in addition to a junction 1323 between the groups 1401 and 1402, e.g., between WL16 and WL17 and between the memory cells 713 and 714.

The region 1305 is at 1 V based on the word line voltage of 0 V minus Vth=−1 V for the erased state data memory cells 711-713 of the first group. The voltage difference between the regions 1301a and 1305 creates an E-field of only 2 V. As a result, electrons are not generated at the junction 1321 and the memory cells of WLn are not disturbed. However, electrons are generated at the junction 1323 due to the E-field of 8 V between the regions 1305 and 1303a. This causes the electrons (denoted by dashes) adjacent to WL16 in the region 1305 to be accelerated into the region 1303a. These electrons can be drawn into the charge trapping regions of the memory cells of WL17, causing disturbs. Compared to FIG. 13B, the disturb is moved from WL14 to WL17. This approach can be useful in some situations, such as when it is know that data will not be stored on all of the drain-side word lines of WLn.

FIG. 14B depicts voltages in a channel in a continuation of FIG. 14A after the pre-charge operation. The word line voltages of the first group are increased from 0 V and reach the pass voltage of 8 V at t7 in FIG. 12A at plot 1210d. The voltage of the channel region 1305 is increased accordingly from 1 V to 9 V so that a channel region 1306 at 9 V is provided. This channel region encompasses the first and second groups of word lines. Although there is a 6 V E-field between the regions 1301a and 1306, the amount of electrons generated in the channel and travelling from the region 1301a to the region 1306 is significantly reduced, so that any disturbs at this time are minimal. Specifically, once the word line voltages of the third group increase to 5 V (the assumed Vth of the highest data state), on the source side of WLn, the residue electrons in the source side channel region 1301a will start to flow toward WLn and across the junction 1321, as the G-state memory cell 710 of WLn−1 starts to become conductive. At this point, the word line voltage on WLn and the first group is still at 0 V, so the electrons are not drawn into the charge trapping region of the memory cell 711 of WLn. Subsequently, as the word line voltages of the third group increase from 5 V to 8 V, the residue electrons in the source side channel region 1301a will finish flowing toward WLn during this time frame. Therefore, when the word line voltage of the first group, which includes WLn and one or more selected drain side word lines of WLn, increases from 0 V to 8 V, the residue electrons have almost stopped coming out from the source side channel and there is little risk of disturb for the memory cell 711.

FIG. 15A depicts voltages in a channel of the string 700n of FIG. 7, after a pre-charge operation, in a third example in which voltages of the first group of adjacent word lines are increased in steps while voltages of remaining word lines are continuously increased, consistent with step 1004a of FIG. 11. In this example, the increase of the word line voltages of the first group (e.g., plot 1240c in FIG. 12B) occurs in two steps, while the increase of the word line voltages of the second and third groups (plot 1210*b* in FIG. 12A) is a continuous, non-stepped increase. The channel voltage profile corresponds to t3 in FIGS. 12A and 12B.

As an example, a first step is provided from Vss to Vint=4 V, which is partway between Vss and Vpass. The channel regions 1300, 1301*a* and 1304 are provided at 2 V, 3 V and 2 V, respectively, as discussed previously. The channel region 1303*a* is provided at 9 V, similar to the channel region 1303 as discussed previously. The junctions 1321-1323 are created as discussed previously.

The region 1305 is at 5 V based on coupling up from an initial 1 V level as in FIG. 14A. The voltage difference between the regions 1301*a* and 1305 creates an E-field of only 2 V, as before, so that electrons are not generated at the junction 1321 and the memory cells of WLn are not disturbed. Additionally, the voltage difference between the regions 1301*a* and 1305 creates an E-field of 4 V which is significantly reduced compared to the 8 V E-field of FIG. 14A. As a result, any disturb of the memory cells of WL17 is significantly reduced. Note that the time period in which Vint is applied, and/or the magnitude of Vint, can be adjusted to optimize the benefit of this approach.

FIG. 15B depicts voltages in a channel in a continuation of FIG. 15A after the pre-charge operation. The word line voltages of the first group are increased from Vint in a second step and reach the pass voltage of 8 V at t7 in FIG. 12B at plot 1240*c*. The voltage of the channel region 1305 is increased accordingly from 5 V to 9 V so that the channel region 1306 at 9 V is provided. As discussed in connection with FIG. 14B, although there is a 6 V E-field between the regions 1301*a* and 1306, any disturbs at this time are minimal.

FIG. 16A depicts voltages in a channel of the string 700*n* of FIG. 7, during a pre-charge operation, in a fourth example in which voltages of the first group of adjacent word lines are increased from a negative voltage while voltages of remaining word lines are increased from 0 V, consistent with step 1003*a* of FIG. 11. This approach reduces the disturb without the time penalty of a stepped increase. Here, a lower initial word line voltage is provided for the first group than for the second and third groups, in the pre-charge phase. The word line voltages can be increased continuously for all groups from the respective initial voltage to the pass voltage. The increase for the first group involves a lower respective initial voltage than the second and third groups. In one approach, the initial word line voltage for the first group is a negative voltage, e.g., −3 V (FIG. 12B, plot 1260*c*), and the initial word line voltage for the second and third groups is 0 V (FIG. 12A, plot 1210*a*). This approach reduces complexity by limiting the word lines which receive the negative voltage to the first group.

By applying a negative voltage to the first group of adjacent word lines during pre-charge, the channel region adjacent to the first group will not be charged up during pre-charge. Moreover, when the word line voltages increase for the first group, because the starting voltage is relatively lower, the time period for the increase will be relatively longer and the effect will be similar to using a lower ramp rate. This technique can further reduce the channel voltage difference between the source and drain-side channels of WLn during the increase of the word line voltages, thereby effectively reducing injection disturb at that time.

Similar to FIG. 13A, voltage profile 1312, the channel regions 1300, 1301, 1303*a* and 1304 are at 2 V, −5 V, 1 V and 2 V, respectively. The channel region 1305 is at −2 V based on the word line voltage of −3 V minus Vth=−1 V for the erased state data memory cells 711-713 of the first group. There is a small E-field of 3 V between the channel regions 1301*a* and 1305, and between the channel regions 1305 and 1303*a*, which does not result in significant disturbs (see channel voltage profile 1610). As the word line voltages of the first, second and third groups start to increase at the same time (t2 in FIGS. 12A and 12B), at a certain time the word line voltages will reach 5 V, for example, for the first and third groups and 2 V for the first group (channel voltage profile 1611). The channel regions 1301*a*, 1305 and 1303*a* are at 0 V, 3 V and 6 V, respectively, due to a 5 V coupling up.

Figure 16B:
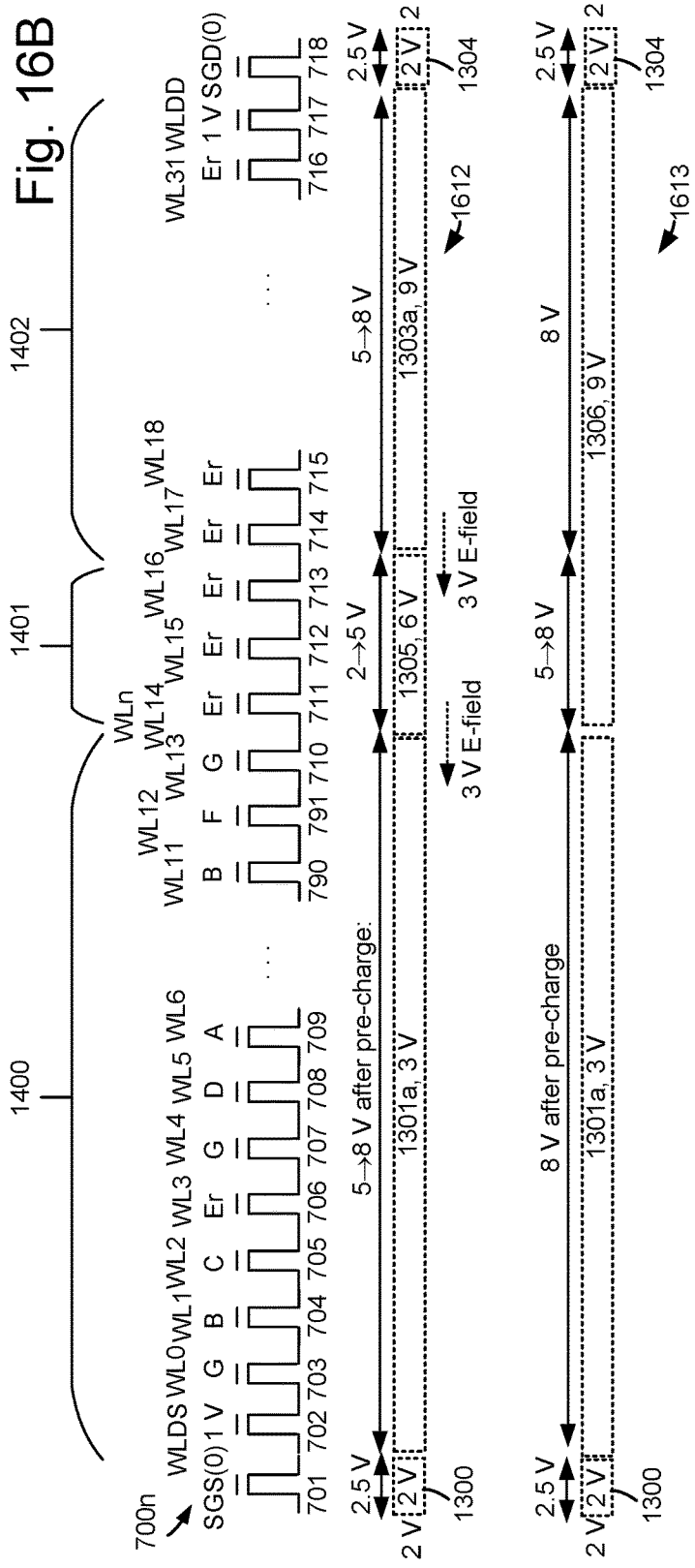
FIG. 16B depicts voltages in a channel in a continuation of FIG. 16A after the pre-charge operation.

FIG. 16B depicts voltages in a channel in a continuation of FIG. 16A after the pre-charge operation. When the word line voltages reach 8 V for the second and third groups (channel voltage profile 1612), the word line voltage will reach 6 V for the first group. The channel regions 1301*a*, 1305 and 1303*a* will be at 3 V, 6 V and 9 V, respectively, due to an additional 3 V coupling up (channel voltage profile 1612). There is a small E-field of 3 V between the channel regions 1301*a* and 1305, and between the channel regions 1305 and 1303*a*, which does not result in significant disturbs. Channel voltage profile 1613 indicates the channel voltages when the word line voltages of the first group reach 8 V. There is an additional 3 V coupling up of the channel region 1305 which results in the channel region 1306 having 9 V. As discussed in connection with FIG. 14B, although there is a 6 V E-field between the regions 1301*a* and 1306, any disturbs at this time are minimal.

Figure 17A:
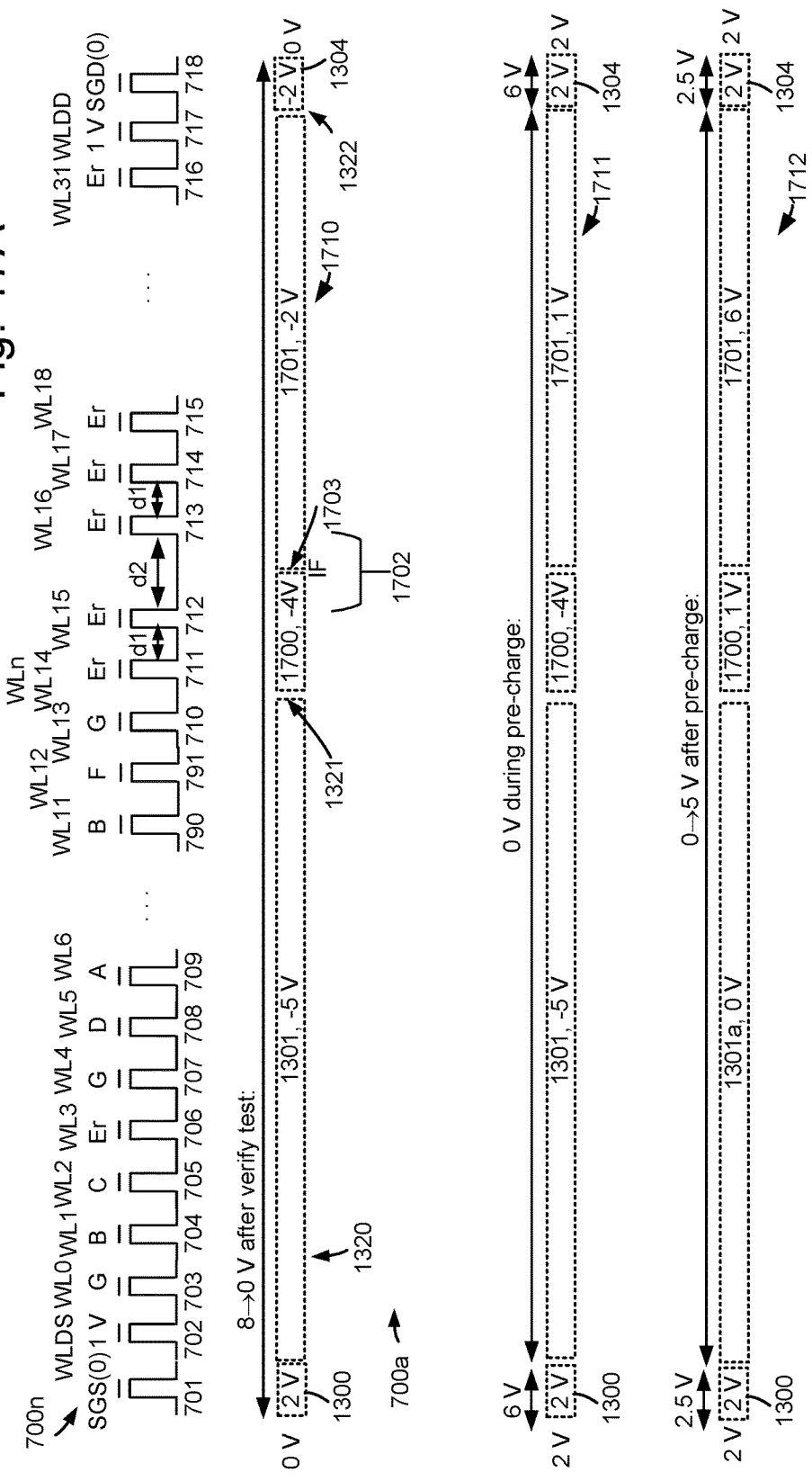
FIG. 17A depicts voltages in a channel of the string 700n of FIG. 7, after a verify test and during and after a pre-charge operation, in a fifth example in which all word line voltages are increased at the same time after the pre-charge operation, where the NAND string has an interface with an increased inter-cell spacing in a multi-tier stack.

FIG. 17A depicts voltages in a channel of the string 700*n* of FIG. 7, after a verify test and during and after a pre-charge operation, in a fifth example in which all word line voltages are increased at the same time after the pre-charge operation, where the NAND string has an interface (IF) with an increased inter-cell spacing in a multi-tier stack. Examples of the interface are provided in FIGS. 6D and 19G. In this example, the interface is between WL15 and WL16, the lower tier comprises WL0-WL15 and the upper tier comprises WL16-WL31. In one example, the lower and upper tiers are bottom and top tiers, respectively. A channel region 1702 at the interface extends between WL15 and WL16. The distance d2 between the memory cells at the interface is larger than the remaining inter-cell distances d1. As a result, the interface channel region 1702 is relatively difficult to turn on (make conductive) using a fringing electric field from the interface cells. Similarly, the interface channel region gets cut off relatively early when the associated word line voltages are decreasing after a verify test.

The channel voltage profile 1710 is comparable to the channel voltage profile 1311 of FIG. 13A, where the word line voltages reach 0 V after a verify test. The same channel region 1301 with −5 V is provided. However, a junction 1703 is also formed due to the cutoff of the interface channel region. As an example, the interface channel region may cutoff when the associated word line voltages (WL15 and WL16) decrease below 4 V. A channel region 1700 at −4 V and a channel region 1701 at −2 V (similar to region 1302 in FIG. 13A) are therefore created.

The channel voltage profiles 1711 and 1712 are comparable to the channel voltage profiles 1312 and 1313, respectively, in FIG. 13A. During pre-charge, when the word line voltages are at 0 V, the channel regions 1701 and 1304 are at 1 V and 2 V, respectively (see channel voltage profile 1711). After pre-charge, when the word line voltages are at 5 V, there is a 5 V coupling up of the channel regions so that the channel regions 1301*a*, 1700 and 1701 are at 0 V, 1 V and 6 V, respectively (see channel voltage profile 1712).

Figure 17B:
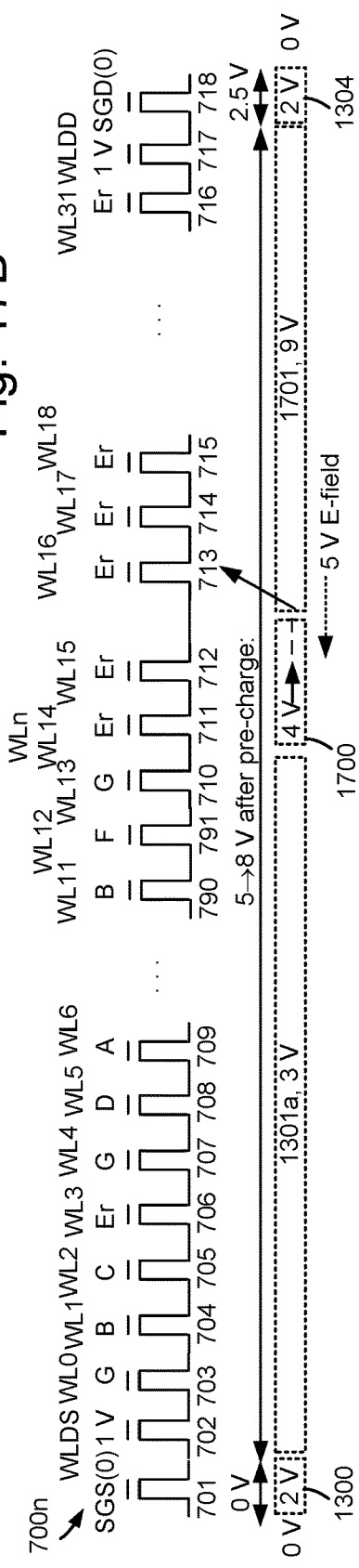
FIG. 17B depicts voltages in a channel in a continuation of FIG. 17A after the pre-charge operation.

FIG. 17B depicts voltages in a channel in a continuation of FIG. 17A after the pre-charge operation. As the word line voltages increase from 5 V and reach 8 V, there is an additional 3 V coupling up of the channel regions so that the channel regions 1301a, 1700 and 1701 are at 3 V, 4 V and 9 V, respectively. A small E-field of 1 V exists between the channel regions 1301a and 1700 so that there is no disturb of the WLn memory cells. This can be compared to the profile 1314 of FIG. 13B, where there is a larger 6 V E-field. This shows that the problem of HEI disturbs for the memory cells of WLn is significantly reduced when WLn is in the lower tier of a multi-tier stack. The use of the disturb countermeasures as described herein can be deployed accordingly. The increasing of the voltage of WLn and the selected memory cell can be controlled according to whether the selected word line is in the upper tier or the lower tier.

In one option, a disturb countermeasure can be used when WLn is in the upper tier but not in the lower tier. In another option, a stronger disturb countermeasure can be used when WLn is in the upper tier compared to when WLn is in the lower tier. For example, a stronger countermeasure can involve using a longer delay for a voltage increase after pre-charge (e.g., plot 1210d compared to plot 1210c in FIG. 12A), a longer hold time at Vint (e.g., plot 1240c compared to plot 1240b in FIG. 12B), a lower rate of increase (e.g., plot 1250b compared to plot 1250a in FIG. 12B) and/or a lower initial voltage during pre-charge (e.g., plot 1260c compared to plot 1260a in FIG. 12B).

A larger E-field of 5 V exists between the channel regions 1700 and 1701 and could cause some disturb of the WL16 cells. This example does not include a disturb countermeasure but demonstrates how disturbs are significantly reduced when WLn is in the lower tier but remains a problem when WLn is in the upper tier of a multi-tier stack.

In some cases, the interface cell 713 in the upper tier can be set as a dummy memory cell so that the disturb of that cell is acceptable. The interface cell 712 in the lower tier could also be set as a dummy memory cell. The disturb countermeasures as described herein can also be used for the case of a string with an increased inter-cell distance between a pair of adjacent memory cells when the increased inter-cell distance is not at the interface of a multi-tier stack.

Figure 18:
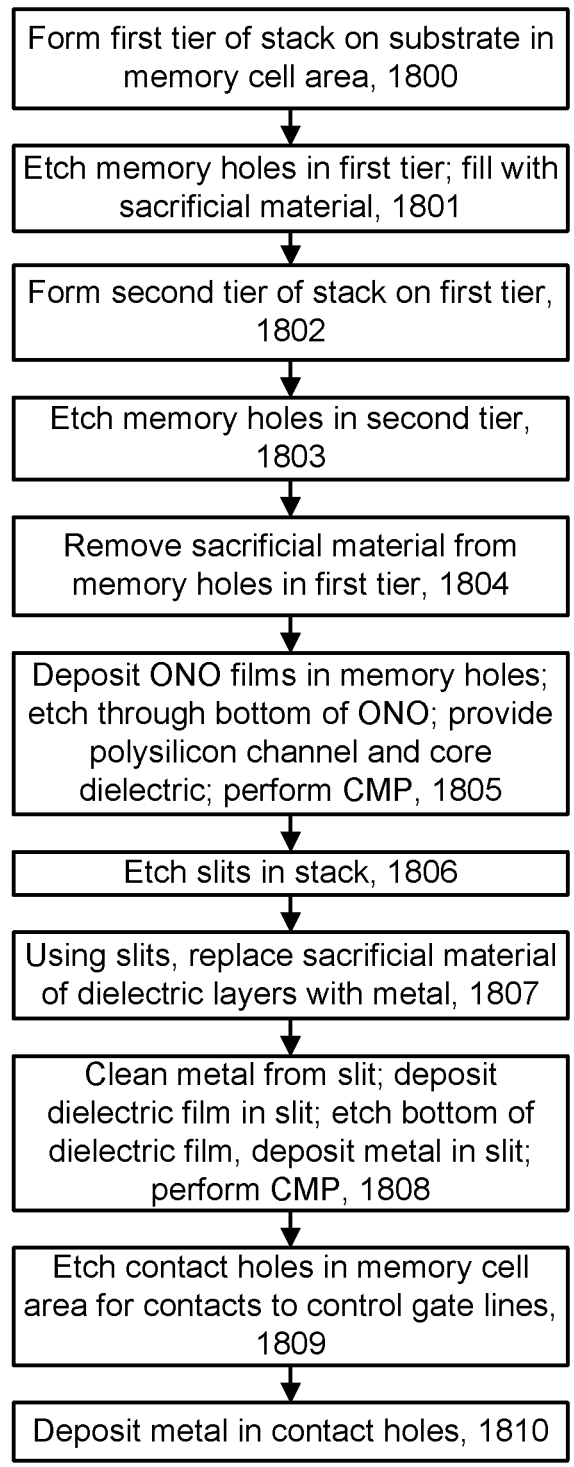
FIG. 18 depicts an example fabrication process for a semiconductor stack comprising two tiers.

FIG. 18 depicts an example fabrication process for a semiconductor stack comprising two tiers. The process can be extended to form more than two tiers. Step 1800 includes forming a first tier of a stack on a substrate in a memory cell area. Step 1801 includes etching memory holes in the first tier, and filling the memory holes with a sacrificial material, such as SiN. See, e.g., FIG. 19A.

Step 1802 includes forming a second tier of the stack on the first tier. Step 1803 includes etching memory holes in the second tier. See, e.g., FIG. 19B. Step 1804 includes removing the sacrificial material from the memory holes in the first tier, e.g., using a wet etch. See, e.g., FIG. 19C.

Step 1805 includes depositing oxide-nitride oxide (ONO) films in the memory holes. See, e.g., FIG. 19D. Step 1806 includes etching slits in the stack. See, e.g., FIG. 19E. Step 1807 includes using the slits to replace the sacrificial material of the dielectric layers of the stack with metal. This can involve providing an etchant via the slit which removes the sacrificial material, creating voids, then providing metal via the slit which fills the voids.

Step 1808 includes cleaning metal from the slit, depositing a dielectric film in the slit which coast the walls of the slit, etching a bottom of the dielectric film, depositing metal in the slit, and performing CMP to remove excess metal. This step can provide a conductive metal path in the slit from a top of the stack to the substrate, to connect to circuitry below the stack. See, e.g., FIG. 19F.

Step 1809 includes etching contact holes in the memory cell area for contacts to the control gate lines. See, e.g., FIG. 19G. Step 1810 includes depositing metal in the contact holes. See, e.g., FIG. 19G.

Note that some of the steps can be performed in a different order than the order shown in FIG. 18.

FIG. 19A depicts a semiconductor structure 1900 in a configuration which is consistent with steps 1800 and 1801 of FIG. 18. The structure includes a memory cell area of a substrate 1901. A peripheral area, not shown, may also be fabricated at the same time. The substrate comprises an intrinsic silicon region 1902, a deep n-well 1903 and a p-well 1904, for instance. A first tier 1905 of a stack includes alternating dielectric layers and control gate layers. The control gate layers may comprise a sacrificial material at this stage of the fabrication. An example dielectric layer 1906 and an example control gate layer 1907 are depicted. This example includes nine control gate layers in the tier. A dielectric layer 1908 extends on top of the stack while a dielectric layer 1909 extends on top of the semiconductor structure. The dielectric layer 1908 may be, e.g., SiOx deposited by LPCVD or PECVD, for instance. The dielectric layer 1909 may be, e.g., SiN deposited by low pressure chemical vapor deposition (LPCVD) or plasma-enhanced chemical vapor deposition (PECVD), for instance.

The semiconductor structure includes a plurality of memory holes which are etched in the tier. An example memory hole 1910 (also referred to as a column or pillar when the memory hole is filled) includes a widened top portion 1911 above an elongated portion 1912. A source-side region 1913 is below the memory hole. A top 1914 and a bottom 1915 of the stack are also depicted. A coordinate system shows x, y and z (vertical) directions.

FIG. 19B depicts a semiconductor structure 1920 in a configuration which is consistent with steps 1802 and 1803 of FIG. 18. A second (top) tier 1916 of the stack is formed on the first tier and also includes alternating dielectric layers and control gate layers. An interface IF at the top of the first tier separates the top and lower tiers. An example dielectric layer 1921 and an example control gate layer 1922 are depicted. This example includes nine control gate layers in the tier. A dielectric layer 1923 extends on top of the semiconductor structure 1920 which comprises a stack 1926 of alternating dielectric layers and control gate layers.

Memory holes, including an example memory hole 1924 are etched in the second tier of the stack. These memory holes are aligned with the sacrificial material in the memory holes in the first tier (e.g., example sacrificial material 1925). In some cases there is a misalignment between the memory holes in the top and lower tiers. The widened top portion 1911 provides an increased area for the memory hole in the upper tier to contact, to ensure that the memory holes are connected to provide a continuous memory hole through both tiers.

FIG. 19C depicts a semiconductor structure 1930 in a configuration which is consistent with step 1804 of FIG. 18. Once the sacrificial material in the first tier is removed, continuous memory holes, such as an example continuous memory hole 1931, are formed which extend through both tiers, from the top of the stack to the bottom of the stack. The continuous memory hole 1931 comprises the memory hole 1932 (or memory hole portion) of the first tier and the memory hole 1924 (or memory hole portion) of the second tier.

FIG. 19D depicts a semiconductor structure 1940 in a configuration which is consistent with step 1805 of FIG. 18. The memory holes are filled with materials such as ONO films, a polysilicon channel and a core dielectric. To provide the polysilicon channel, amorphous silicon may be deposited follow by a heating step. This results in a column 1941 (e.g., pillar) comprising a column 1942 in the second tier above a column 1943 in the first tier.

FIG. 19E depicts a semiconductor structure 1950 in a configuration which is consistent with step 1806 of FIG. 18. Slits, including an example slit 1951, are formed periodically in the y direction in the stack. Each slit may have a uniform cross-section in the y-z plane and extend across the stack in the x direction.

FIG. 19F depicts a semiconductor structure 1960 in a configuration which is consistent with steps 1807 and 1808 of FIG. 18. By providing an etchant in the slits, the sacrificial material of the control gate layers is removed. Voids created in the control gate layers are subsequently filled with a metal such as tungsten. For example, a metal (e.g., conductive layer) is provided for the control gate layer 1922. A metal residual is then removed from the slits and a dielectric film 1963 is deposited in the slits, leaving a void in the slit. The void may extend from the p-well at a bottom of the stack to the top of the stack. The slit may be filled with a metal 1972 which provides a metal interconnect to the substrate.

FIG. 19G depicts a semiconductor structure 1970 in a configuration which is consistent with steps 1809 and 1810 of FIG. 18. Contacts holes are etched in the stack outside the area with the memory holes to provide voids which extend upward from terraced edges of control gate layers to the top of the stack. The contact holes are then filled with metal to provide metal vias which connect the control gate layers to the top of the stack. Subsequent processing involves connected metal paths above the stack to the contacts. The metal paths may in turn be connected to voltage sources, for example, or other circuitry. An example via 1971 is connected to the control gate layer 1962. The distances d1 and d2 between memory cells, discussed previously, are also depicted. See also the region 623 in FIG. 6D for a close-up view of the region 623 of the stack.

The semiconductor structure is an example of a three-dimensional structure in which memory cells are arranged in strings.

The stack comprises a plurality of alternating conductive and dielectric layers. The conductive layers are connected to control gates of memory cells and other transistors such as SGD and SGS transistors in each string. In one approach, the conductive layers and associated memory cells in the top and lower tiers are separate by a distance d1. The conductive layers and associated memory cells which are adjacent to the interface may be separate from one another by a larger distance d2.

In one implementation, an apparatus comprises: a set of strings, each string comprising a drain-end select gate transistor at a drain-end of the string; a set of word line connected memory cells in the strings; a set of bit lines connected to the drain-ends of the strings; and a control circuit configured to, in a program loop for a selected word line (e.g., WL14 in FIG. 14A-16B) of the set of word lines: increase a voltage of the selected word line to a pass voltage, and increase a voltage of one drain-side word line (e.g., WL15 or WL16) of the selected word line to the pass voltage, wherein at least one of a timing or a respective initial voltage is different for the increase of voltage of the selected word line compared to the increase of the voltage of the one drain-side word line.

Optionally, another drain-side word line (e.g., WL15) of the selected word line is between the one drain-side word line (e.g., WL16) and the selected word line (e.g., WL14); the control circuit is configured to, in the program loop, increase a voltage of the another drain-side side word line to the pass voltage; and at least one of a timing or respective initial voltage of the increase of the voltage of the another drain-side word line is different compared to the increase of the voltage of the selected word line and compared to the increase of the voltage of the one drain-side word line.

In another implementation, a method comprises: performing a pre-charge phase of a program loop for a string, wherein the string comprises a drain-end select gate transistor at a drain-end of the string, a selected memory cell connected to a selected word line, a first group of adjacent memory cells comprising the selected memory cell and one or more drain-side word liens of the selected word line, a second group of memory cells on a drain-side of the first group, a first set of unselected word lines is connected to the first group of adjacent memory cells, a second set of unselected word lines is connected to the second group of memory cells, and the performing the pre-charge phase comprises applying a positive voltage to a bit line connected to the drain-end while providing the drain-end select gate transistor in a conductive state and while providing voltages of the first set of unselected word lines at a respective initial voltage and providing voltages of the second set of unselected word lines at a respective initial voltage; and after the pre-charge phase, increasing the voltages of the first set of unselected word lines from the respective initial voltage to a pass voltage, and increasing the voltages of the second set of unselected word lines from the respective initial voltage to the pass voltage, wherein a completion of the increasing of the voltages of the first set of unselected word lines is after a completion of the increasing of the voltages of the second set of unselected word.

In another implementation, an apparatus comprises: a NAND string comprising a plurality of memory cells, the NAND string extends vertically in a stack of alternating conductive regions and dielectric regions, wherein the conductive regions are connected to control gates of the plurality of memory cells, the stack comprises a lower tier and a upper tier separated by one of the dielectric regions, and a height of the one of the dielectric regions is at least twice a height of other ones of the dielectric regions, and the plurality of memory cells comprise a selected memory cell connected to a selected word line, and a drain-side memory cell; means for, in a program loop for the selected memory, increasing a voltage of the drain-side memory cell from a respective initial voltage to a pass voltage independently of whether the selected word line is in the upper tier or the lower tier; means for, in the program loop for the selected memory, increasing a voltage of the selected memory cell from a respective initial voltage to the pass voltage, wherein the increasing of the voltage of the selected memory cell is controlled according to whether the selected word line is in the upper tier or the lower tier; and means for, in the program loop for the selected memory, increasing a voltage of the selected memory cell from the pass voltage to a program voltage.

The means for increasing the voltage of the drain-side memory cell may include the power control module 116, the control circuitry 110 and the controller 122 of FIG. 1, and the driver 447a of FIG. 4, or other logic hardware, and/or other executable code stored on a computer readable storage medium or device. Other embodiments may include similar or equivalent means.

The means for increasing the voltage of the selected memory cell may include the power control module 116, the control circuitry 110 and the controller 122 of FIG. 1, and the driver 447 of FIG. 4, or other logic hardware, and/or other executable code stored on a computer readable storage medium or device. Other embodiments may include similar or equivalent means.

The foregoing detailed description of the invention has been presented for purposes of illustration and description. It is not intended to be exhaustive or to limit the invention to the precise form disclosed. Many modifications and variations are possible in light of the above teachings. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:

1. An apparatus, comprising:
a set of NAND strings, each NAND string of the set of NAND strings comprising a drain-end select gate transistor and a channel;
a set of word lines connected to memory cells in the set of NAND strings;
a set of bit lines connected to the set of NAND strings; and
a control circuit configured to, in a program loop for a selected word line of the set of word lines:
pre-charge the channels of the NAND strings;
during the pre-charge, provide a respective initial voltage on the selected word line and a respective initial voltage on one drain-side word line of the selected word line; and
after the pre-charge, increase a voltage of the selected word line from the respective initial voltage to a pass voltage, and from the pass voltage to a program voltage, and increase a voltage of the one drain-side word from the respective initial voltage to the pass voltage, wherein the increase of the voltage of the selected word line from the respective initial voltage to the pass voltage is after the increase of the voltage of the one drain-side word line from the respective initial voltage to the pass voltage.

2. The apparatus of claim 1, wherein:
a rate of the increase of the voltage of the selected word line from the respective initial voltage to the pass voltage is less than a rate of the increase of the voltage of the one drain-side word line from the respective initial voltage to the pass voltage.

3. The apparatus of claim 1, wherein:
the control circuit is configured to determine whether the selected word line is in an upper tier or a lower tier of a multi-tier stack;
the multi-tier stack comprises alternating conductive regions and dielectric regions;
the lower tier and the upper tier are separated by one of the dielectric regions;
a height of the one of the dielectric regions is at least twice a height of other ones of the dielectric regions;
when the selected word line is in the upper tier, the increase of the voltage of the selected word line comprises an increase from the respective initial voltage to an intermediate voltage, a hold at the intermediate voltage for a period of time, and an increase from the intermediate voltage to the pass voltage; and when the selected word line is in the lower tier, the increase of the voltage of the selected word line comprises a continuous increase from the respective initial voltage to the pass voltage.

4. The apparatus of claim 1, wherein:
the control circuit is configured to:
during the pre-charge, provide a respective initial voltage on a source-side word line of the selected word line; and
in the program loop, increase a voltage of the source-side word line from the respective initial voltage to the pass voltage, wherein the respective initial voltage of the source-side word line is equal to the respective initial voltage of the one drain-side word line, and a timing of the increase of the voltage of the source-side word line from the respective initial voltage to the pass voltage is equal to a timing of the increase of the voltage of the one drain-side word line from the respective initial voltage to the pass voltage.

5. The apparatus of claim 1, wherein:
the control circuit is configured to:
during the pre-charge, provide a respective initial voltage on another drain-side word line of the selected word line at a respective initial voltage, the another drain-side word line of the selected word line is between the one drain-side word line and the selected word line; and
in the program loop, increase a voltage of the another drain-side word line from the respective initial voltage to the pass voltage; and
the increase of the voltage of the another drain-side word line from the respective initial voltage to the pass voltage is before the increase of the voltage of the selected word line from the respective initial voltage to the pass voltage and after the increase of the voltage of the one drain-side word line from the respective initial voltage to the pass voltage.

6. The apparatus of claim 5, wherein:
a rate of the increase of the voltage of the another drain-side word line to the pass voltage is lower than a rate of the increase of the voltage of the one drain-side word line to the pass voltage and higher than a rate of the increase of the voltage of the selected word line to the pass voltage.

7. The apparatus of claim 5, wherein:
the increase of the voltage of the another drain-side word line from the respective initial voltage to the pass voltage comprise a multi-step increase with a hold for a first time period at a respective intermediate level;
the increase of the voltage of the selected word line from the respective initial voltage to the pass voltage comprise a multi-step increase with a hold for a second time period at a respective intermediate level, the second time period is longer than the first time period; and
the increase of the voltage of the one drain-side word line from the respective initial voltage to the pass voltage comprise a continuous increase without a hold.

8. The apparatus of claim 1, wherein:
the control circuit is configured to adjust a delay of the start of the increase of the voltage of the selected word line from the respective initial voltage to the pass voltage relative to the start of the increase of the voltage of the one drain-side word line from the respective initial voltage to the pass voltage based on whether the selected word line is in a upper tier or a lower tier of a multi-tier stack;

the multi-tier stack comprises alternating conductive regions and dielectric regions;

the lower tier and the upper tier are separated by one of the dielectric regions; and a height of the one of the dielectric regions is at least twice a height of other ones of the dielectric regions.

9. The apparatus of claim 8, wherein:

the control circuit is configured to provide a lower rate of the increase of voltage of the selected word line from the respective initial voltage to the pass voltage when the selected word line is in the upper tier than when the selected word line is in the lower tier.

10. The apparatus of claim 8, wherein:

the control circuit is configured to provide a longer time period for the increase of the voltage of the selected word line from the respective initial voltage to the pass voltage when the selected word line is in the upper tier than when the selected word line is in the lower tier.

11. The apparatus of claim 1, wherein:

the control circuit is configured to adjust a timing of the increase of the voltage of the selected word line from the respective initial voltage to the pass voltage relative to the increase of the voltage of the one drain-side word line from the respective initial voltage to the pass voltage to provide a relatively weak disturb countermeasure when the selected word line is in a lower tier of a multi-tier stack and to provide a relatively strong disturb countermeasure when the selected word line is in an upper tier of the multi-tier stack;

the multi-tier stack comprises alternating conductive regions and dielectric regions;

the lower tier and the upper tier are separated by one of the dielectric regions; and a height of the one of the dielectric regions is at least twice a height of other ones of the dielectric regions.

12. A method, comprising:

performing a pre-charge phase of a program loop for a NAND string, wherein the NAND string comprises a drain-end select gate transistor at a drain-end of the NAND string, a selected memory cell connected to a selected word line, a first group of adjacent memory cells comprising the selected memory cell and one or more drain-side memory cells of the selected memory cell, a second group of memory cells on a drain-side of the first group, a first set of word lines is connected to the first group of adjacent memory cells, a second set of word lines is connected to the second group of memory cells, and the performing the pre-charge phase comprises applying a positive voltage to a bit line connected to the drain-end while providing the drain-end select gate transistor in a conductive state and while providing voltages of the first set of word lines at a respective initial voltage and providing voltages of the second set of word lines at a respective initial voltage; and after the pre-charge phase, increasing the voltages of the first set of word lines from the respective initial voltage to a pass voltage, and increasing the voltages of the second set of word lines from the respective initial voltage to the pass voltage, wherein a completion of the increasing of the voltages of the first set of word lines is after a completion of the increasing of the voltages of the second set of word.

13. The method of claim 12, wherein:

a time period of increasing of the voltages of the first set of word lines is longer than a time period of the increasing of the voltages of the second set of word lines.

14. The method of claim 12, wherein:

the increasing of the voltages of the first set of word lines comprises an increase from the respective initial voltage to an intermediate voltage, a hold at the intermediate voltage for a period of time, and an increase from the intermediate voltage to the pass voltage; and the increasing of the voltages of the second set of word lines comprises a continuous increase from the respective initial voltage to the pass voltage.

15. The method of claim 12, wherein:

the respective initial voltage of the first set of word lines is a negative voltage and is less than the respective initial voltage of the second set of word lines.

16. An apparatus, comprising:

a NAND string comprising a plurality of memory cells, the NAND string extends vertically in a stack of alternating conductive regions and dielectric regions, wherein the conductive regions are connected to control gates of the plurality of memory cells, the stack comprises a lower tier and a upper tier separated by one of the dielectric regions, and a height of the one of the dielectric regions is at least twice a height of other ones of the dielectric regions, and the plurality of memory cells comprise a selected memory cell connected to a selected word line, and a drain-side memory cell;

means for, in a program loop for the selected memory cell, increasing a voltage of the drain-side memory cell from a respective initial voltage to a pass voltage independently of whether the selected word line is in the upper tier or the lower tier;

means for, in the program loop for the selected memory cell, increasing a voltage of the selected memory cell from a respective initial voltage to the pass voltage, wherein the increasing of the voltage of the selected memory cell is controlled according to whether the selected word line is in the upper tier or the lower tier; and means for, in the program loop for the selected memory, increasing a voltage of the selected memory cell from the pass voltage to a program voltage.

17. The apparatus of claim 16, wherein:

the respective initial voltage of the selected memory cell is lower when the selected word line is in the upper tier than when the selected word line is in the lower tier.

18. The apparatus of claim 16, wherein:

a rate of the increase of the voltage of the selected memory cell is lower when the selected word line is in the upper tier than when the selected word line is in the lower tier.

19. The apparatus of claim 1, wherein:

the one drain-side word line is non-adjacent to the selected word line; and the control circuit is configured to during the pre-charge, provide a respective initial voltage on an adjacent word line on a drain-side of the selected word line and provide a respective initial voltage on an adjacent word line on a source-side of the selected word line, and after the pre-charge, increase a voltage of the adjacent word line on the drain-side of the selected word line from the respective initial voltage to the pass voltage at a same time as the increase of the voltage of the selected word line from the respective initial voltage to the pass voltage, and increase a voltage of the adjacent word line on the source-side of the selected word line from the respective initial voltage to the pass voltage before the increase of the voltage of the selected word line from the respective initial voltage to the pass voltage.

20. The apparatus of claim 1, wherein:
the respective initial voltage on the selected word line and the respective initial voltage on the one drain-side word line are 0 V.

\* \* \* \* \*